US012805393B2

(12) United States Patent
Liu et al.

(10) Patent No.: US 12,805,393 B2
(45) Date of Patent: Nov. 17, 2026

(54) DEVICE COMPRISING STACKED THROUGH ENCAPSULATION VIA INTERCONNECTS

(71) Applicant: QUALCOMM Incorporated, San Diego, CA (US)

(72) Inventors: Kai Liu, Phoenix, AZ (US); Jui-Yi Chiu, Taichung City (TW); Jonghae Kim, San Diego, CA (US); Je-Hsiung Lan, San Diego, CA (US); Nosun Park, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 488 days.

(21) Appl. No.: 18/352,976

(22) Filed: Jul. 14, 2023

(65) Prior Publication Data

US 2025/0022858 A1 Jan. 16, 2025

(51) Int. Cl.
*H10W 90/00* (2026.01)
*H10W 20/40* (2026.01)
(Continued)

(52) U.S. Cl.
CPC ......... *H10W 90/00* (2026.01); *H10W 20/497* (2026.01); *H10W 72/07236* (2026.01);
(Continued)

(58) Field of Classification Search
CPC ......... H01F 17/0013; H01F 2017/0086; H01F 2017/04; H01F 2017/048;
(Continued)

(56) References Cited

U.S. PATENT DOCUMENTS

2008/0061420 A1* 3/2008 Degani ............... H01F 17/0006 438/109
2014/0246753 A1* 9/2014 Song .................. H10W 20/497 438/109

(Continued)

FOREIGN PATENT DOCUMENTS

EP 1901353 A2 3/2008

OTHER PUBLICATIONS

International Search Report and Written Opinion—PCT/US2024/035832—ISA/EPO—Oct. 16, 2024.

*Primary Examiner* — Wael M Fahmy
*Assistant Examiner* — Shamita S Hanumasagar
(74) *Attorney, Agent, or Firm* — Loza & Loza, LLP

(57) ABSTRACT

A device comprising (i) a first device portion comprising: a die substrate; at least one first dielectric layer; a first plurality of interconnects; a first encapsulation layer; and a first plurality of via interconnects located at least in the first encapsulation layer; (ii) a second device portion comprising: at least one second dielectric layer; a second plurality of interconnects; a second encapsulation layer; and a second plurality of via interconnects located at least in the second encapsulation layer; and (iii) a first plurality of solder interconnects coupled to the first device portion and the second device portion, wherein the first plurality of interconnects, the first plurality of via interconnects, the first plurality of solder interconnects, the second plurality of interconnects and the second plurality of via interconnects are configured to operate as an inductor.

15 Claims, 22 Drawing Sheets

PROFILE CROSS SECTIONAL VIEW

(51) Int. Cl.
*H10W 72/00* (2026.01)
*H10W 72/20* (2026.01)
*H10W 72/90* (2026.01)

(52) U.S. Cl.
CPC .... *H10W 72/07252* (2026.01); *H10W 72/227* (2026.01); *H10W 72/9415* (2026.01); *H10W 90/728* (2026.01)

(58) Field of Classification Search
CPC ........... H01L 2224/02372; H01L 2224/05009; H01L 2224/05025; H01L 2224/05146; H01L 2224/05567; H01L 2224/14; H01L 2224/16; H01L 2224/17; H01L 2224/6265; H01L 2224/81; H01L 23/5226; H01L 23/5227; H01L 24/14; H01L 24/16; H01L 24/17; H01L 24/81; H01L 2924/19042; H01L 2924/19101–19104; H10D 1/20; H10W 20/497; H10W 72/227; H10W 72/07236; H10W 72/07252; H10W 90/00
See application file for complete search history.

(56) References Cited

U.S. PATENT DOCUMENTS

| | | | | |
|---|---|---|---|---|
| 2015/0031184 | A1 | 1/2015 | Yen et al. | |
| 2021/0280540 | A1* | 9/2021 | Kim | H10W 70/611 |
| 2022/0375865 | A1* | 11/2022 | Pietambaram | H01F 17/0013 |
| 2023/0082743 | A1* | 3/2023 | Yun | H01F 17/0013 257/531 |
| 2023/0307341 | A1* | 9/2023 | Brun | H10W 42/121 |
| 2024/0097648 | A1* | 3/2024 | Brunner | H03H 3/02 |
| 2024/0105687 | A1* | 3/2024 | Buot | H01L 23/5387 |

* cited by examiner

PROFILE CROSS SECTIONAL VIEW

PROFILE CROSS SECTIONAL VIEW

PROFILE CROSS SECTIONAL VIEW

PROFILE CROSS SECTIONAL VIEW

PROFILE CROSS SECTIONAL VIEW

PROFILE CROSS SECTIONAL VIEW

PROFILE CROSS SECTIONAL VIEW

7

DEVICE COMPRISING STACKED THROUGH ENCAPSULATION VIA INTERCONNECTS

FIELD

Various features relate to passive devices.

BACKGROUND

Packages can include a substrate, an integrated device and a passive device. The substrate may include a plurality of interconnects. The integrated device and/or the passive device may be coupled to interconnects of the substrate. There is an ongoing need to provide smaller packages with improved performances.

SUMMARY

Various features relate to passive devices.

One example provides a device comprising (i) a first device portion comprising: a die substrate; at least one first dielectric layer; a first plurality of interconnects; a first encapsulation layer; and a first plurality of via interconnects located at least in the first encapsulation layer; (ii) a second device portion comprising: at least one second dielectric layer; a second plurality of interconnects; a second encapsulation layer; and a second plurality of via interconnects located at least in the second encapsulation layer; and (iii) a first plurality of solder interconnects coupled to the first device portion and the second device portion, wherein the first plurality of interconnects, the first plurality of via interconnects, the first plurality of solder interconnects, the second plurality of interconnects and the second plurality of via interconnects are configured to operate as an inductor.

Another example provides a method that provides a first device portion comprising: a die substrate; at least one first dielectric layer; a first plurality of interconnects; a first encapsulation layer; and a first plurality of via interconnects located at least in the first encapsulation layer. The method couples a second device portion to the first device portion through a first plurality of solder interconnects, the second device portion comprising: at least one second dielectric layer; a second plurality of interconnects; a second encapsulation layer; and a second plurality of via interconnects located at least in the second encapsulation layer. The first plurality of solder interconnects are coupled to the first device portion and the second device portion. The first plurality of interconnects, the first plurality of via interconnects, the first plurality of solder interconnects, the second plurality of interconnects and the second plurality of via interconnects are configured to operate as an inductor.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a device comprising (i) a first device portion comprising: a die substrate; at least one first dielectric layer; a first plurality of interconnects; a first encapsulation layer; and a first plurality of via interconnects located at least in the first encapsulation layer; (ii) a second device portion comprising: at least one second dielectric layer; a second plurality of interconnects; a second encapsulation layer; and a second plurality of via interconnects located at least in the second encapsulation layer; and (iii) a first plurality of solder interconnects coupled to the first device portion and the second device portion, wherein the first plurality of interconnects, the first plurality of via interconnects, the first plurality of solder interconnects, the second plurality of interconnects and the second plurality of via interconnects are configured to operate as an inductor. The stacking of two device portions with via interconnects in encapsulation layers help provide an inductor with a high Q factor.

Exemplary Device Comprising Stacked Portions with Via Interconnects

Figure 1:
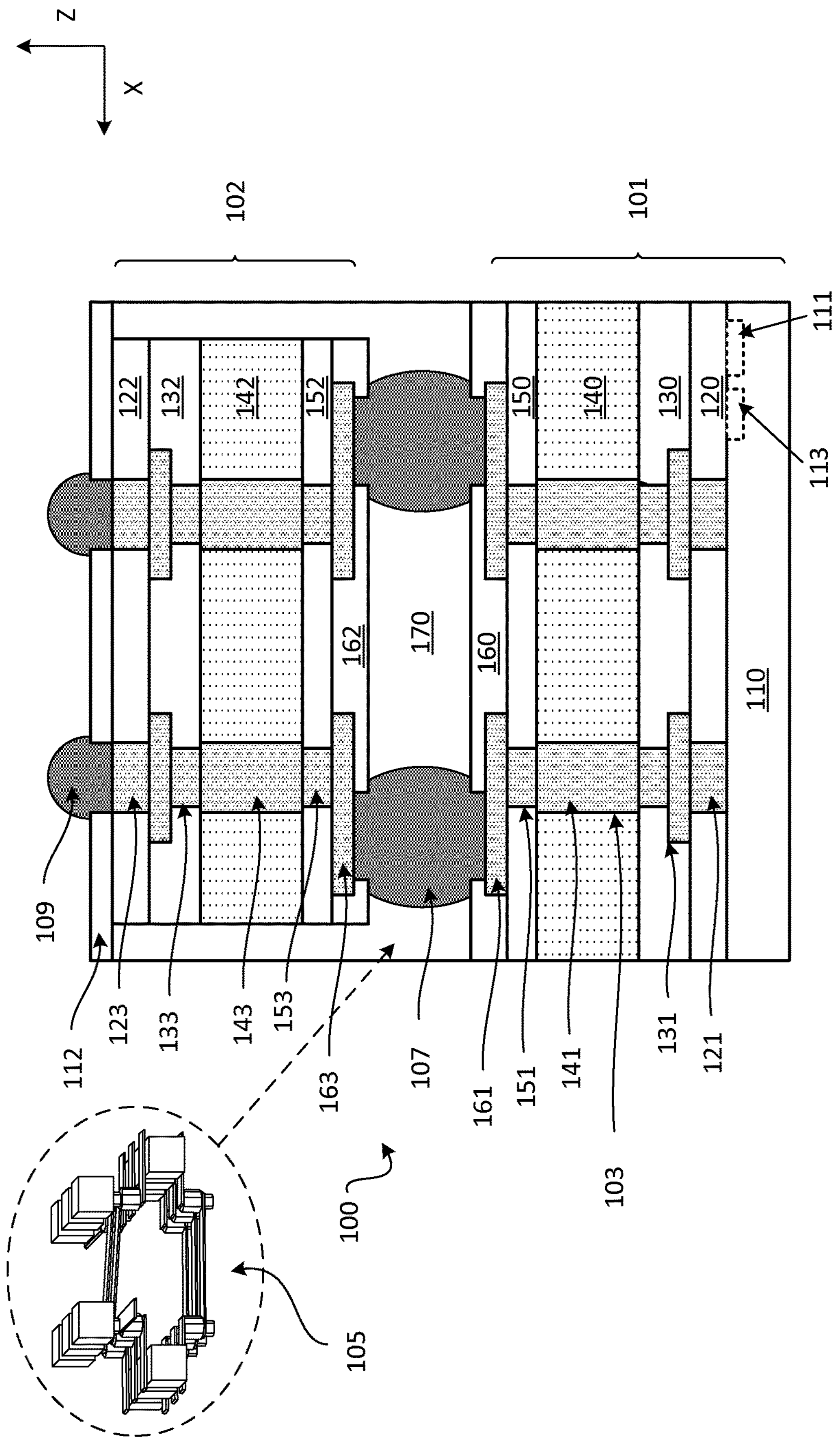
FIG. 1 illustrates an exemplary profile view of a device that includes stacked device portions with via interconnects.

FIG. 1 illustrates a profile view of a device 100 that includes stacked portions with via interconnects. In some implementations, the device 100 may be a passive device. The device 100 may be configured to operate as an inductor. The device 100 may include components that are configured as an inductor (e.g., solenoid inductor). The device 100 may be coupled to an interposer, a package substrate or a board (e.g., printed circuit board).

The device 100 includes a first device portion 101, a second device portion 102, a plurality of solder interconnects 107, an encapsulation layer 170, a dielectric layer 112 and a plurality of solder interconnects 109. The second device portion 102 is coupled to the first device portion 101 through the plurality of solder interconnects 107. The encapsulation layer 170 may at least partially encapsulate the second device portion 102 and the plurality of solder interconnects 107. The encapsulation layer 170 may be coupled to the first device portion 101 (e.g., coupled to a surface of the first device portion). The encapsulation layer 170 may include a mold, a resin and/or an epoxy. As will be further described below, components in the device 100 may be configured as an inductor 103. FIG. 1 illustrates an inductor 105, which may be a conceptual representation of the inductor 103. The first device portion 101 and the second device portion 102 may be stacked (e.g., vertically stacked) device portions.

The first device portion 101 may be a first passive device portion. The first device portion 101 includes a die substrate 110, an encapsulation layer 120, a dielectric layer 130, an encapsulation layer 140, a dielectric layer 150, a dielectric layer 160, a plurality of interconnects 121, a plurality of interconnects 131, a plurality of via interconnects 141, a plurality of interconnects 151 and a plurality of interconnects 161. The plurality of interconnects 121 may be located at least partially in the encapsulation layer 120. The plurality of interconnects 131 may be located at least partially in the dielectric layer 130. The plurality of via interconnects 141 may be located at least partially in the encapsulation layer 140. The plurality of interconnects 151 may be located at least partially in the dielectric layer 150. The plurality of interconnects 161 may be located at least partially in the dielectric layer 160. The encapsulation layer 140 may be located between the dielectric layer 130 and the dielectric layer 150. The encapsulation layer 140 may include a mold, a resin and/or an epoxy. The encapsulation layer 140 may include a magnetic layer. The encapsulation layer 120 may include a mold, a resin and/or an epoxy. The encapsulation layer 120 and/or the encapsulation layer 140 may be a type of dielectric layer that is different from the encapsulation layer 120, the dielectric layer 130, the dielectric layer 150, and/or the dielectric layer 160. The encapsulation layer 120, the dielectric layer 130, the encapsulation layer 140, the dielectric layer 150, and/or the dielectric layer 160 may be located over the die substrate 110. The encapsulation layer 120 may be coupled to a surface of the die substrate 110. The die substrate 110 may include silicon (Si). In some implementations, the die substrate 110 may include filters 111 and/or transistors 113.

The plurality of interconnects 121 are coupled to the plurality of interconnects 131. The plurality of interconnects 131 are coupled to the plurality of via interconnects 141. The plurality of via interconnects 141 are coupled to the plurality of interconnects 151. The plurality of interconnects 151 are coupled to the plurality of interconnects 161. The plurality of interconnects 121, the plurality of interconnects 131, the plurality of via interconnects 141, the plurality of interconnects 151 and/or the plurality of interconnects 161 may be configured to operate as an inductor (e.g., solenoid) or part of an inductor (e.g., part of an inductor). The plurality of interconnects 121, the plurality of interconnects 131, the plurality of via interconnects 141, the plurality of interconnects 151 and/or the plurality of interconnects 161 may define windings of an inductor (e.g., windings of solenoid inductor).

The second device portion 102 may be a second passive device portion. The second device portion 102 includes an encapsulation layer 122, a dielectric layer 132, an encapsulation layer 142, a dielectric layer 152, a dielectric layer 162, a plurality of interconnects 123, a plurality of interconnects 133, a plurality of via interconnects 143, a plurality of interconnects 153 and a plurality of interconnects 163. The plurality of interconnects 123 may be located at least partially in the encapsulation layer 122. The plurality of interconnects 133 may be located at least partially in the dielectric layer 132. The plurality of via interconnects 143 may be located at least partially in the encapsulation layer 142. The plurality of interconnects 153 may be located at least partially in the dielectric layer 152. The plurality of interconnects 163 may be located at least partially in the dielectric layer 162. The encapsulation layer 142 may be located between the dielectric layer 132 and the dielectric layer 152. The encapsulation layer 142 may include a mold, a resin and/or an epoxy. The encapsulation layer 142 may include a magnetic layer. The encapsulation layer 122 may include a mold, a resin and/or an epoxy. The encapsulation layer 122 and/or the encapsulation layer 142 may be a type of dielectric layer that is different from the dielectric layer 132, the dielectric layer 152, and/or the dielectric layer 162. The dielectric layer 130, the dielectric layer 150, the dielectric layer 160, the dielectric layer 162, the dielectric layer 152 and/or the dielectric layer 132 may include polyimide. FIG. 1 illustrates that the second device portion 102 may be free of a die substrate (e.g., free of silicon substrate).

The plurality of interconnects 123 are coupled to the plurality of interconnects 133. The plurality of interconnects 133 are coupled to the plurality of via interconnects 143. The plurality of via interconnects 143 are coupled to the plurality of interconnects 153. The plurality of interconnects 153 are coupled to the plurality of interconnects 163. The plurality of interconnects 123, the plurality of interconnects 133, the plurality of via interconnects 143, the plurality of interconnects 153 and/or the plurality of interconnects 163 may be configured to operate as an inductor (e.g., solenoid) or part of an inductor (e.g., part of an inductor). The plurality of interconnects 123, the plurality of interconnects 133, the plurality of via interconnects 143, the plurality of interconnects 153 and/or the plurality of interconnects 163 may define windings of an inductor (e.g., windings of solenoid inductor).

The plurality of interconnects 121, the plurality of interconnects 131, the plurality of via interconnects 141, the plurality of interconnects 151, the plurality of interconnects 161, the plurality of solder interconnects 107, the plurality of interconnects 163, the plurality of via interconnects 143, the plurality of interconnects 133 and/or the plurality of interconnects 123 may be configured to operate as an inductor 103 (e.g., solenoid inductor). For example, at least part of the plurality of interconnects 121, the plurality of interconnects 131, the plurality of via interconnects 141, the plurality of interconnects 151, the plurality of interconnects 161, the plurality of solder interconnects 107, the plurality of interconnects 163, the plurality of via interconnects 143, the plurality of interconnects 133 and/or the plurality of interconnects 123 may be defined as windings of the inductor 103 (e.g., windings of solenoid inductor).

In some implementations, the plurality of interconnects 131, the plurality of interconnects 151, the plurality of interconnects 161, the plurality of interconnects 163, the plurality of interconnects 153 and/or the plurality of interconnects 133 may include a plurality of metallization interconnects. A plurality of metallization interconnects may include a plurality of redistribution interconnects. The plurality of via interconnects 141 and/or the plurality of via interconnects 143 may be examples of through encapsulation via interconnects. The plurality of via interconnects 141 and the plurality of via interconnects 143 may represent stacked through encapsulation via interconnects.

In some implementations, at least some of the interconnects from the plurality of interconnects 131 and/or at least some of the interconnects from the plurality of interconnects 133 may define and/or form horizontal winding portions of an inductor.

As mentioned above, the second device portion 102 is coupled to the first device portion 101 through the plurality of solder interconnects 107. The plurality of solder interconnects 107 are coupled to the plurality of interconnects 161 and the plurality of interconnects 163. The location and/or portion of the plurality of solder interconnects 107 may be offset (e.g., horizontally offset, horizontal center to center offset) from the plurality of via interconnects 141 and/or the plurality of via interconnects 143. In some implementations, offsetting the plurality of solder interconnects 107 from the plurality of via interconnects 141 and/or the plurality of via interconnects 143 helps reduce delamination of the dielectric layers which helps provide a more robust and reliable connection of the interconnects. In some implementations, offsetting the plurality of solder interconnects 107 from the plurality of via interconnects 141 and/or the plurality of via interconnects 143 helps improve the Q factor of the inductor by increasing the effective aperture size of the inductor, which is further described below in detail in at least FIG. 2.

A dielectric layer 112 is coupled to the encapsulation layer 170 and the encapsulation layer 122. The dielectric layer 112 may include openings. The plurality of solder interconnects 109 may be coupled to the plurality of interconnects 123 through openings in the dielectric layer 112. In some implementations, the dielectric layer 112 may be a solder resist layer.

Different implementations may have different heights for the device 100. For example, in some implementations, the plurality of via interconnects 141 may have a thickness in a range of about 150-200 micrometers. In some implementations, the plurality of via interconnects 143 may have a thickness in a range of about 150-200 micrometers. In some implementations, the plurality of solder interconnects may have a thickness in a range of about 100-200 micrometers. In some implementations, the first device portion 101 may have a thickness in a range of about 150-200 micrometers. In some implementations, the second device portion 102 may have a thickness in a range of about 150-200 micrometers. In some implementations, the device 100 may have a thickness in a range of about 450-600 micrometers. The above dimensions may be applicable to any of the devices and/or device portions described in the disclosure. As will be further described below, some implementations of a device may include pillar interconnects. In some implementations, the combination of the pillar interconnects and the solder interconnects may have an overall thickness in a range of about 150-200 micrometers. It is noted that the dimensions and/or thicknesses of any of the devices and/or their components are not limited by the range in values described above.

Figure 2:
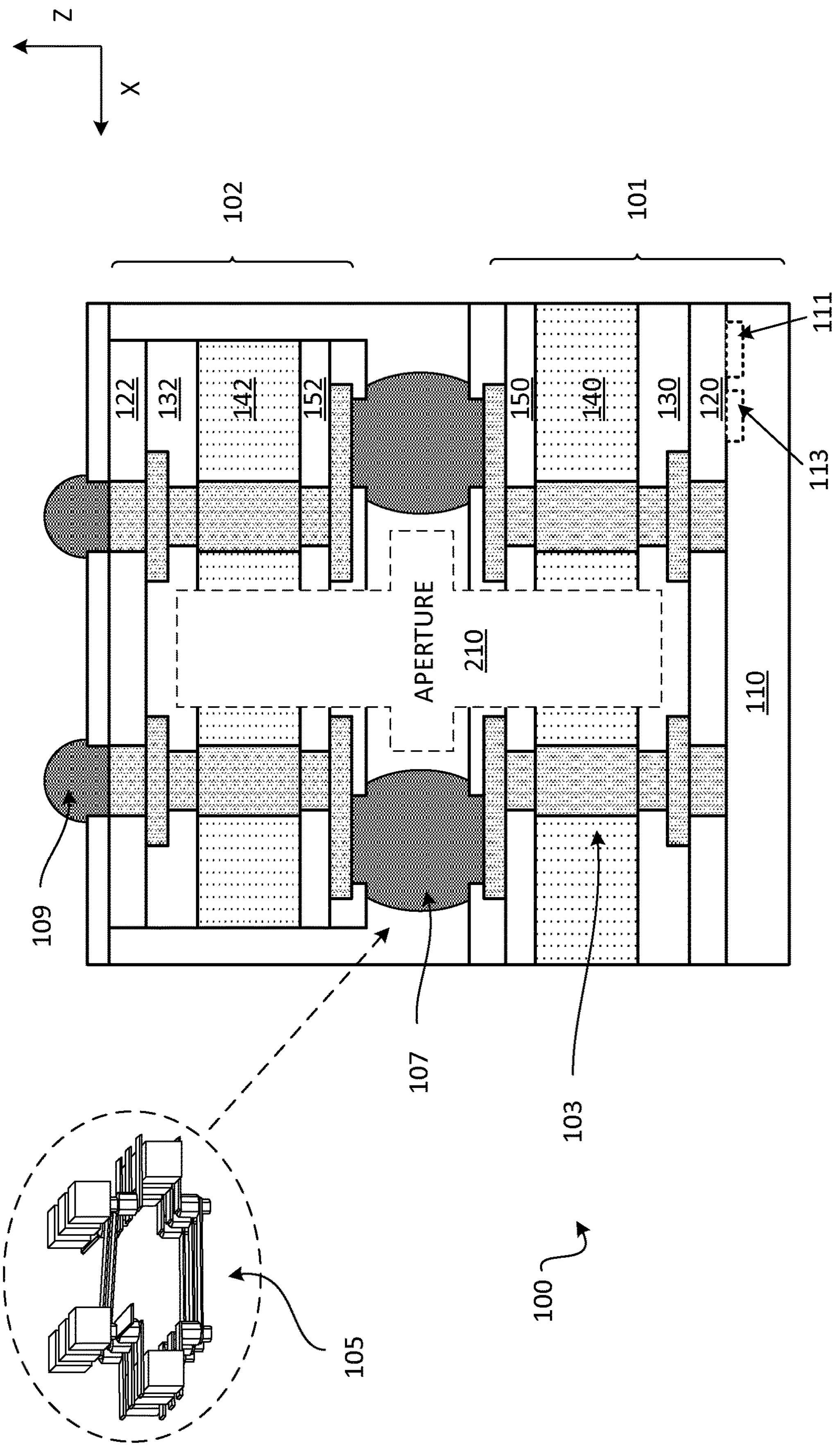
FIG. 2 illustrates an exemplary profile view of a device that includes stacked device portions with via interconnects.

As mentioned above, the inductance and/or the Q factor of an inductor may be proportional to the size of the aperture of the inductor. Thus, everything else being the same, a larger aperture may result in a larger inductance in the inductor. FIG. 2 illustrates the device 100 with the inductor 103. The inductor 103 includes aperture 210. The aperture 210 conceptually represents the aperture of the inductor 103 and is not intended to represent the exact shape and/or size of the aperture of the inductor 103. As mentioned above one advantage of offsetting (e.g., center to center horizontal offset) the plurality of solder interconnects 107 from the plurality of via interconnects 141 and/or the plurality of via interconnects 143 is that it increases the aperture of the inductor 103 while also reducing likelihood of delamination of the dielectric layers.

Figure 3:
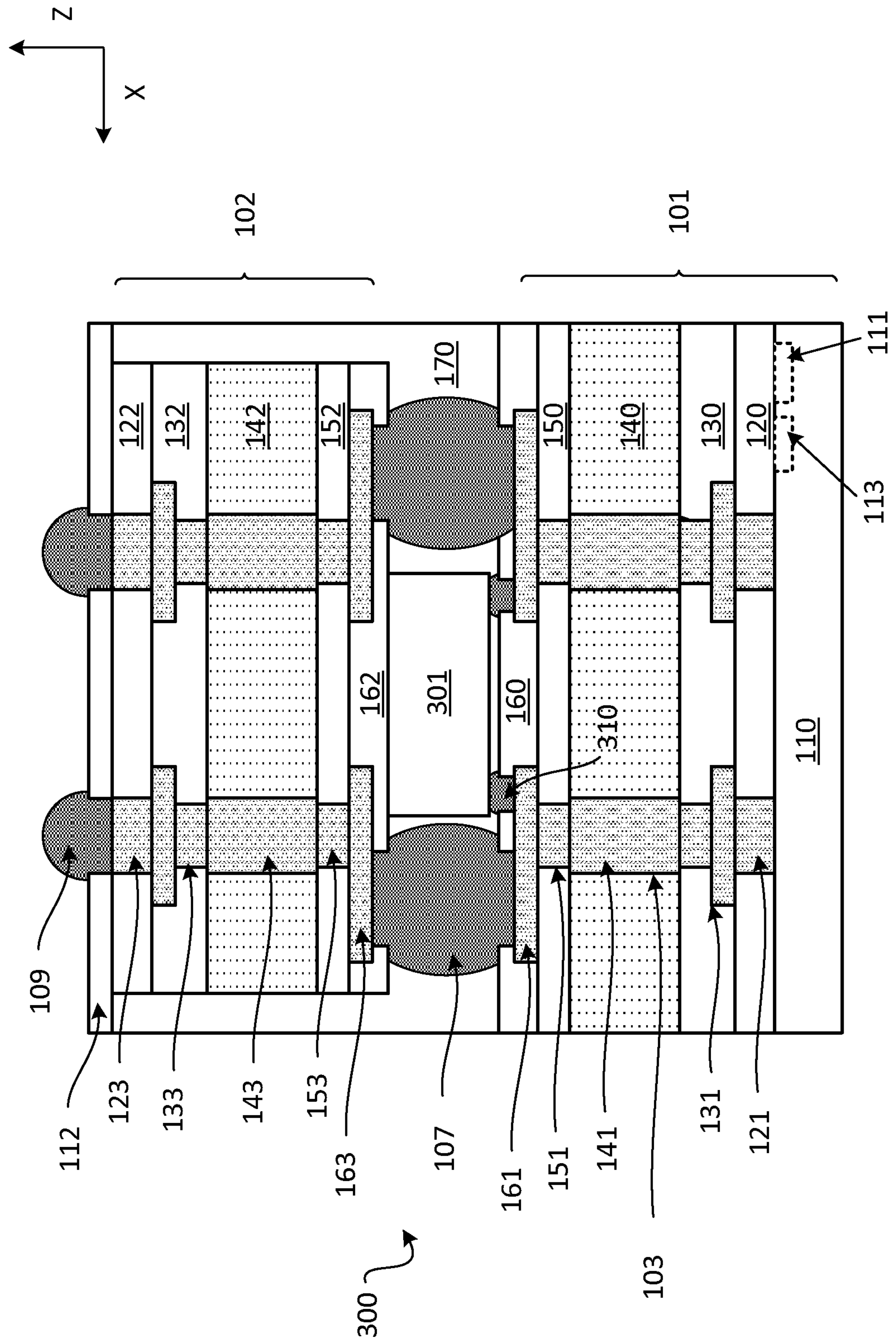
FIG. 3 illustrates an exemplary profile view of a device that includes stacked device portions with via interconnects.

FIG. 3 illustrates a device 300 that includes stacked device portions with via interconnects. The device 300 is similar to the device 100 and includes similar components. The device 300 includes the first device portion 101, the second device portion 102, the plurality of solder interconnects 107, the encapsulation layer 170, the dielectric layer 112, the plurality of solder interconnects 109 and/or the inductor 103, as described for the device 100.

FIG. 3 also illustrates that the device 300 also includes a passive component 301. The passive component 301 may include a metal-insulator-metal (MIM) capacitor. The passive component 301 may be coupled to the first device portion 101 through a plurality of solder interconnects 310. The passive component 301 is configured to be electrically coupled interconnects that define the inductor 103. The passive component 301 is coupled to the plurality of interconnects 161 through a plurality of solder interconnects 310. The passive component 301 may be laterally surrounded by the plurality of solder interconnects 107. The passive component 301 may be located in the device 300 such that the passive component 301 is surrounded by the windings of the inductor 103 (e.g., surrounded by interconnects and/or via interconnects that form an inductor). The encapsulation layer 170 may at least partially encapsulate the passive component 301 and/or the plurality of solder interconnects 310. The back side of the passive component 301 may be the second device portion 102. For example, the back side of the passive component 301 may be touching the dielectric layer 162. However, in some implementations, there may be an encapsulation layer (e.g., 170) between the back side of the passive component 301 and the dielectric layer 162. In some implementations, more than one passive component may be coupled to the interconnects that define the inductor 103. In some implementations, the passive component 301 may be coupled to the plurality of interconnects 163 through a plurality of solder interconnects. In some implementations, instead of and/or in conjunction with the passive component 301, an acoustic device may be part of the device 300. Thus, an acoustic device may be coupled to the plurality of interconnects 161 and/or the plurality of interconnects 163.

Figure 4:
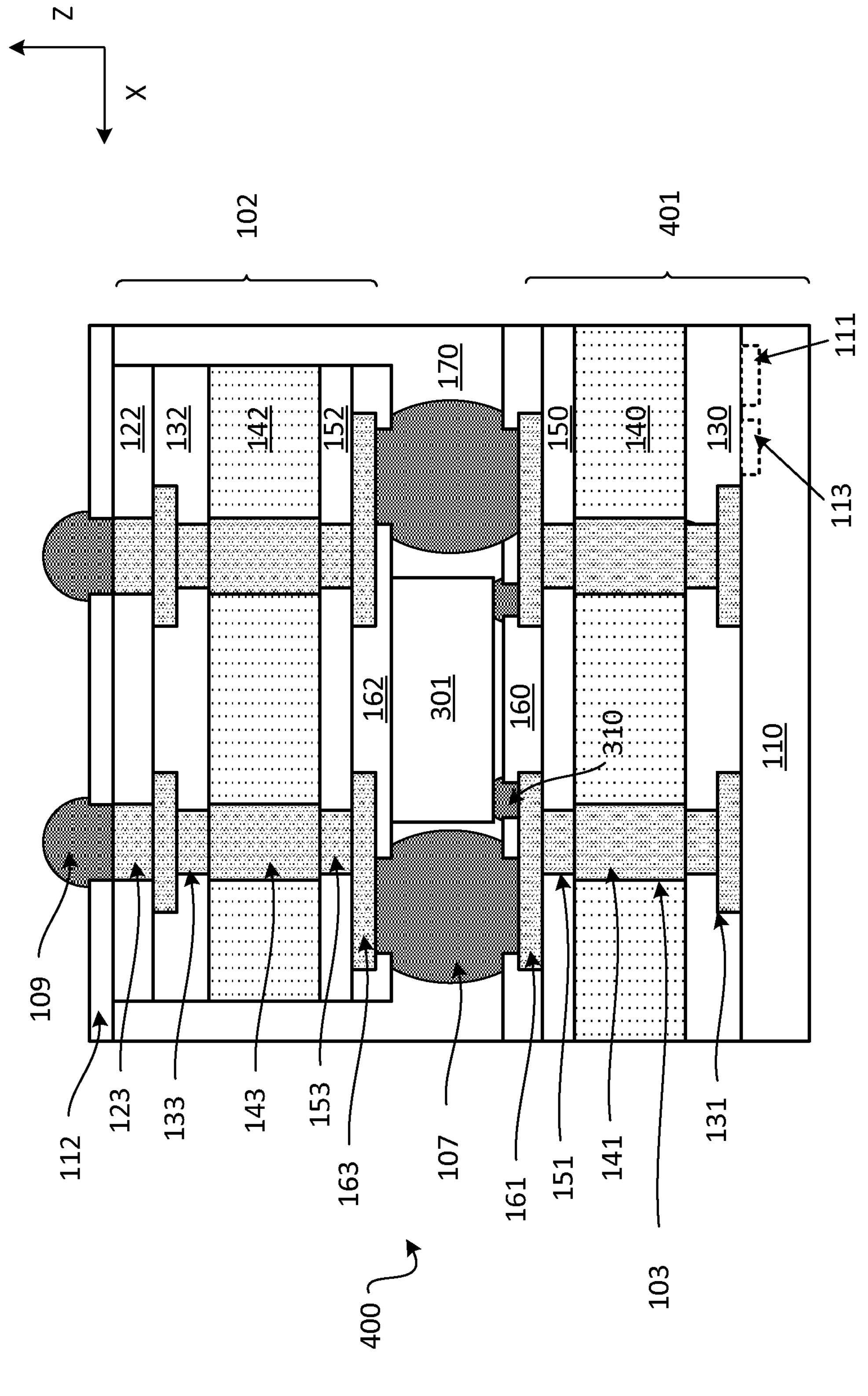
FIG. 4 illustrates an exemplary profile view of a device that includes stacked device portions with via interconnects.

FIG. 4 illustrates a device 400 that includes stacked device portions with via interconnects. The device 400 is similar to the device 100 and/or the device 300, and includes similar components. The device 400 includes a first device portion 401, the second device portion 102, the plurality of solder interconnects 107, the encapsulation layer 170, the dielectric layer 112, the plurality of solder interconnects 109, the inductor 103 and/or the passive component 301, as described for the device 100 and the device 300. The first device portion 401 is similar to the first device portion 101 of the device 100. However, the first device portion 401 does not include the encapsulation layer 120 and the plurality of interconnects 121. The dielectric layer 130 is coupled to a surface of the die substrate 110. It is noted that the encapsulation layer 120 and/or the plurality of interconnects 121 may be optional for any of devices described in the disclosure.

Figure 5:
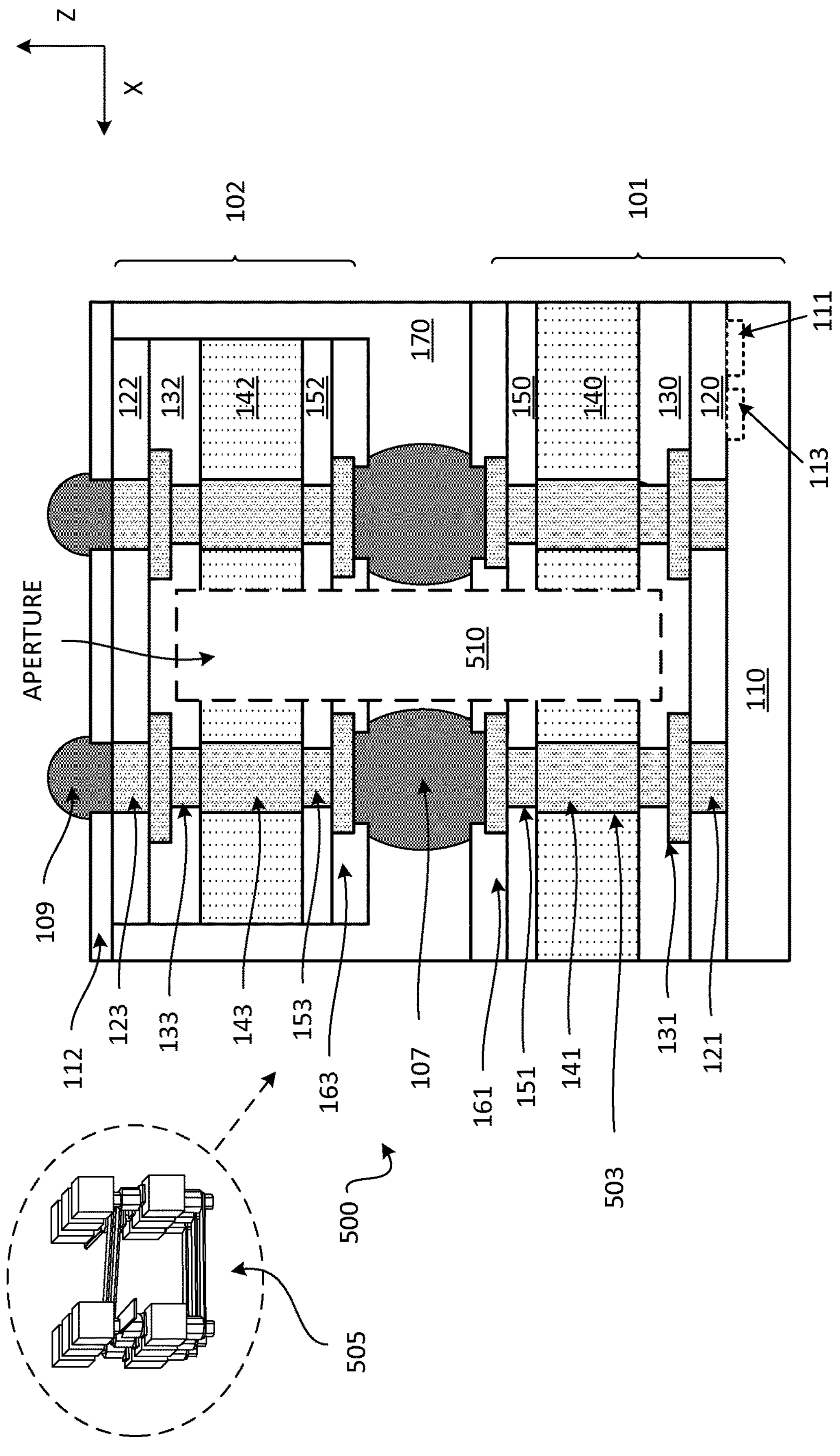
FIG. 5 illustrates an exemplary profile view of a device that includes stacked device portions with via interconnects.

FIG. 5 illustrates a device 500 that includes stacked device portions with via interconnects. The device 500 is similar to the device 100, and includes similar components. The device 500 includes the first device portion 101, the second device portion 102, the plurality of solder interconnects 107, the encapsulation layer 170, the dielectric layer 112, the plurality of solder interconnects 109, as described for the device 100. As shown in FIG. 5, the plurality of solder interconnects 107 is not offset from the plurality of via interconnects 141 and/or the plurality of via interconnects 143. However, the plurality of solder interconnects 107 may not be as offset from the plurality of via interconnects 141 and/or the plurality of via interconnects 143, as shown in FIG. 1. Thus, the center to center horizontal offset between the plurality of solder interconnects 107 and the plurality of via interconnects (e.g., 141, 143) in FIG. 5 may be less than the center to center horizontal offset between the plurality of solder interconnects 107 and the plurality of via interconnects (e.g., 141, 143) in FIG. 1.

The result is an inductor 503 with an aperture 510 that is smaller than the aperture 210 of the inductor 103. This may result in the inductor 503 of FIG. 5 having a lower inductance than the inductor 103 of FIG. 1. The plurality of interconnects 121, the plurality of interconnects 131, the plurality of via interconnects 141, the plurality of interconnects 151, the plurality of interconnects 161, the plurality of solder interconnects 107, the plurality of interconnects 163, the plurality of via interconnects 143, the plurality of interconnects 133 and/or the plurality of interconnects 123 may be configured to operate as an inductor 503 (e.g., solenoid inductor). FIG. 5 illustrates an inductor 505, which may be a conceptual representation of the inductor 503.

Figure 6:
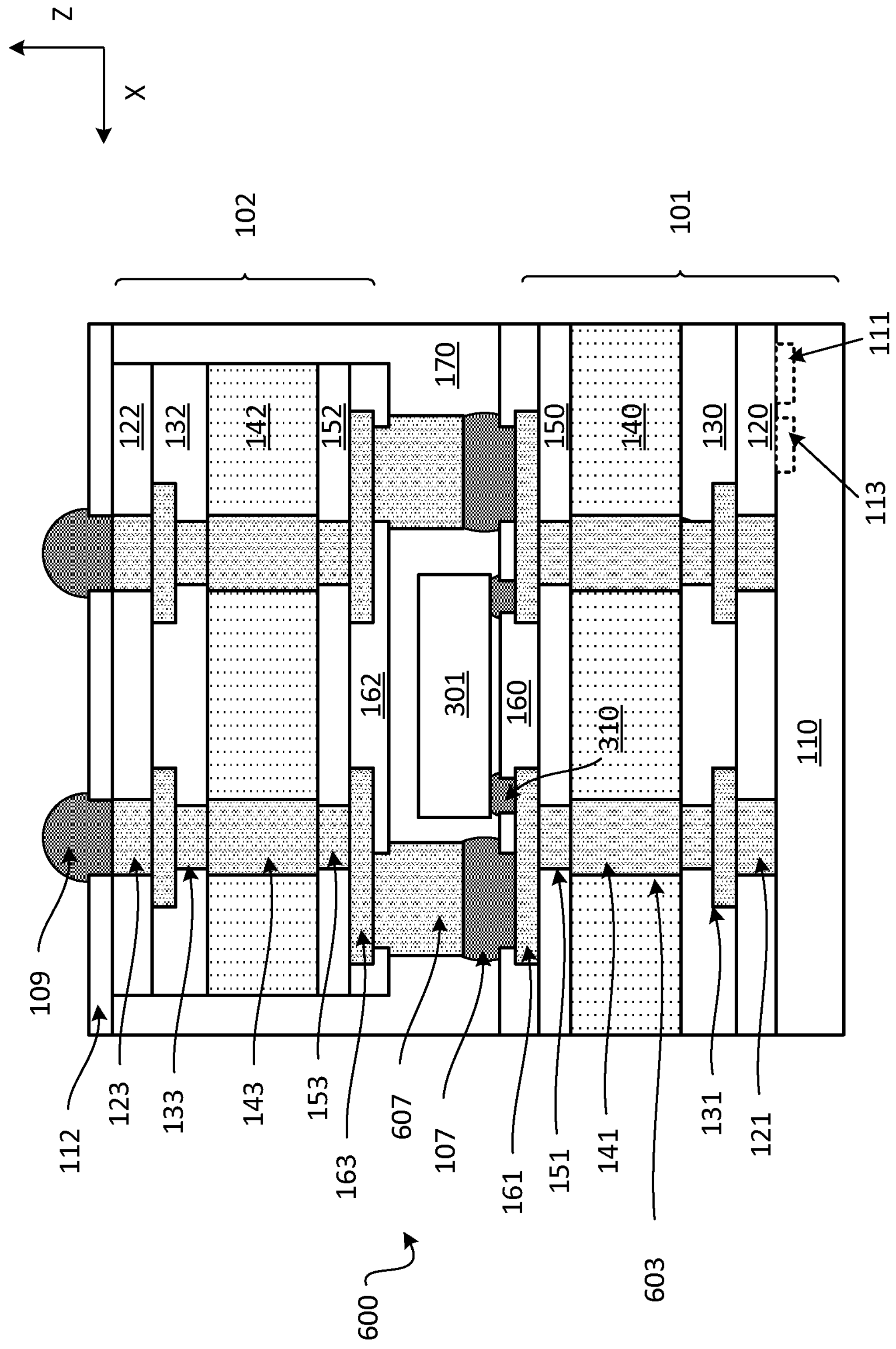
FIG. 6 illustrates an exemplary profile view of a device that includes stacked device portions with via interconnects.

In some implementations, a device may include pillar interconnects. FIG. 6 illustrates a device 600 that includes stacked device portions with via interconnects. The device 600 is similar to the device 300 and the device 100, and includes similar components. The device 600 includes the first device portion 101, the second device portion 102, the plurality of solder interconnects 107, the encapsulation layer 170, the dielectric layer 112, the plurality of solder interconnects 109, the passive component 301, as described for the device 100 and the device 300.

As shown in FIG. 6, the device 600 includes a plurality of pillar interconnects 607. The plurality of pillar interconnects 607 may be coupled to the plurality of interconnects 163. The plurality of solder interconnects 107 is coupled to the plurality of pillar interconnects 607 and the plurality of interconnects 161. The encapsulation layer 170 may at least partially encapsulate the plurality of pillar interconnects 607. In some implementations, the plurality of pillar interconnects 607 may considered part of the second device portion 102.

The plurality of interconnects 121, the plurality of interconnects 131, the plurality of via interconnects 141, the plurality of interconnects 151 the plurality of interconnects 161, the plurality of solder interconnects 107, the plurality of pillar interconnects 607, the plurality of interconnects 163, the plurality of via interconnects 143, the plurality of interconnects 133 and/or the plurality of interconnects 123 may be configured to operate as an inductor 603 (e.g., solenoid inductor). For example, at least part of the plurality of interconnects 121, the plurality of interconnects 131, the plurality of via interconnects 141, the plurality of interconnects 151 the plurality of interconnects 161, the plurality of solder interconnects 107, the plurality of pillar interconnects 607, the plurality of interconnects 163, the plurality of via interconnects 143, the plurality of interconnects 133 and/or the plurality of interconnects 123 may be defined as windings of the inductor 603 (e.g., windings of solenoid inductor).

Figure 7:
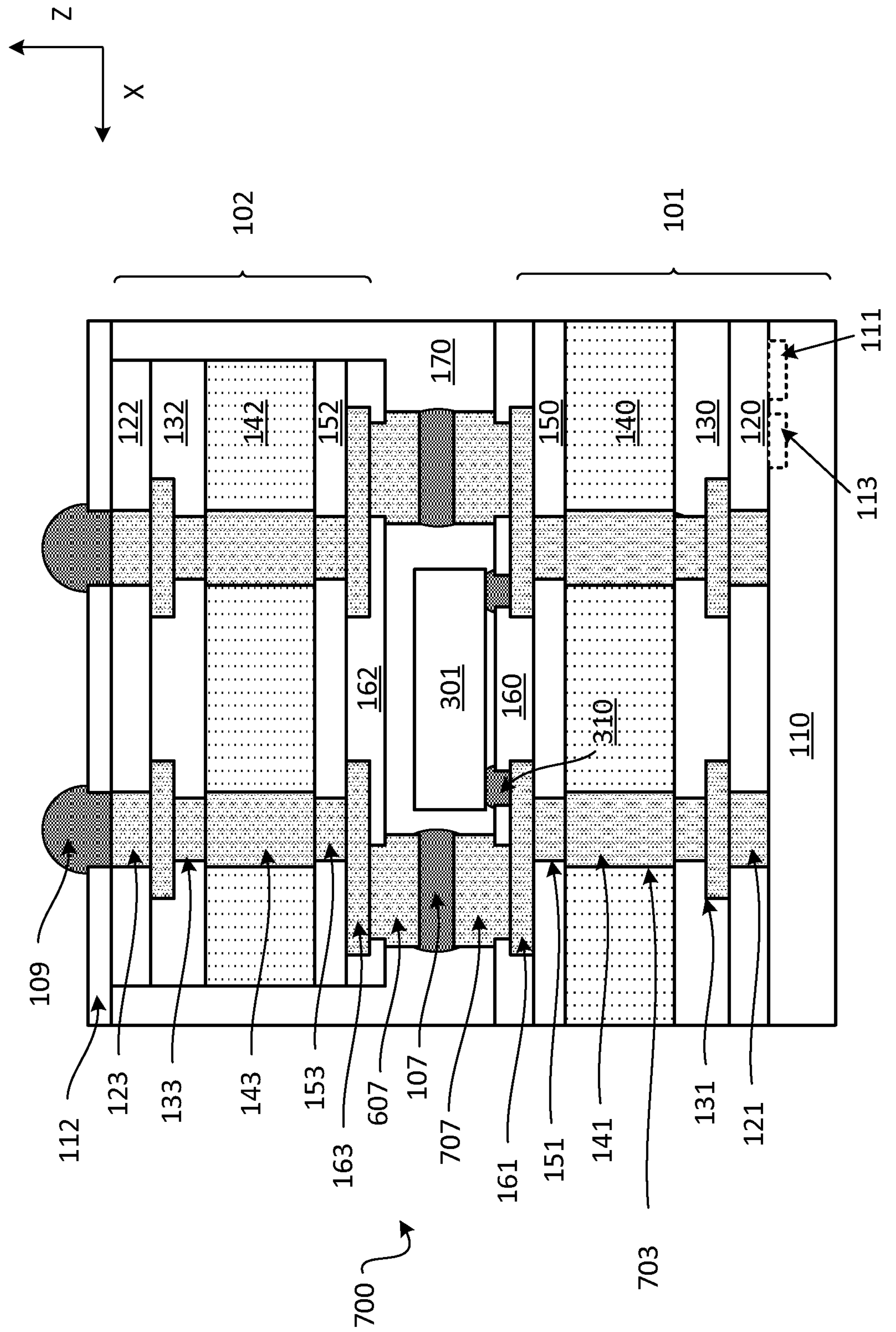
FIG. 7 illustrates an exemplary profile view of a device that includes stacked device portions with via interconnects.

In some implementations, instead of or in addition to the plurality of pillar interconnects 607, a device may include a plurality of pillar interconnects that is coupled to the plurality of interconnects 161. FIG. 7 illustrates a device 700 that includes stacked device portions with via interconnects. The device 700 is similar to the device 600, and includes similar components. The device 700 includes the first device portion 101, the second device portion 102, the plurality of solder interconnects 107, the encapsulation layer 170, the dielectric layer 112, the plurality of solder interconnects 109, the passive component 301, as described for the device 100 and the device 300.

As shown in FIG. 7, the device 700 also includes a plurality of pillar interconnects 607 and a plurality of pillar interconnects 707. The plurality of pillar interconnects 607 are coupled to the plurality of interconnects 163. The plurality of pillar interconnects 707 are coupled to the plurality of interconnects 161. The plurality of solder interconnects 107 are coupled to the plurality of interconnects 161 and the plurality of interconnects 163. In some implementations, the plurality of pillar interconnects 707 may be considered part of the first device portion 101. In some implementations, the plurality of pillar interconnects 607 may be considered part of the second device portion 102.

The plurality of interconnects 121, the plurality of interconnects 131, the plurality of via interconnects 141, the plurality of interconnects 151 the plurality of interconnects 161, the plurality of pillar interconnects 707, the plurality of solder interconnects 107, the plurality of pillar interconnects 607, the plurality of interconnects 163, the plurality of via interconnects 143, the plurality of interconnects 133 and/or the plurality of interconnects 123 may be configured to operate as an inductor 703 (e.g., solenoid inductor). For example, at least part of the plurality of interconnects 121, the plurality of interconnects 131, the plurality of via interconnects 141, the plurality of interconnects 151 the plurality of interconnects 161, the plurality of pillar interconnects 707, the plurality of solder interconnects 107, the plurality of pillar interconnects 607, the plurality of interconnects 163, the plurality of via interconnects 143, the plurality of interconnects 133 and/or the plurality of interconnects 123 may be defined as windings of the inductor 703 (e.g., windings of solenoid inductor).

Figure 8:
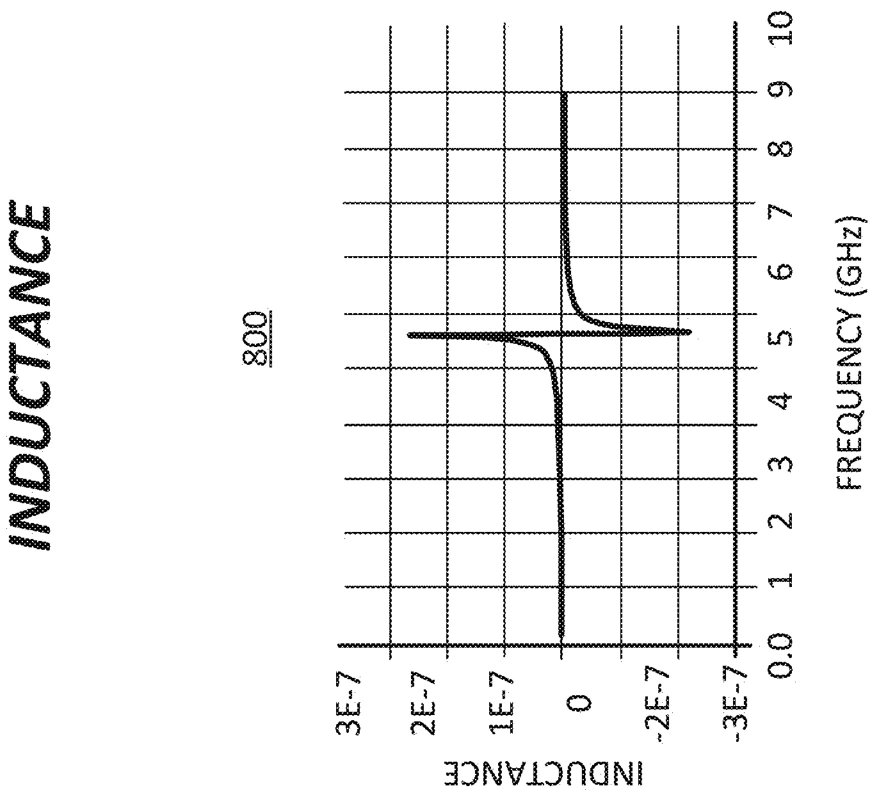
FIG. 8 illustrates an exemplary graph of inductance of an inductor from a device that includes stacked device portions with via interconnects.
Figure 9:
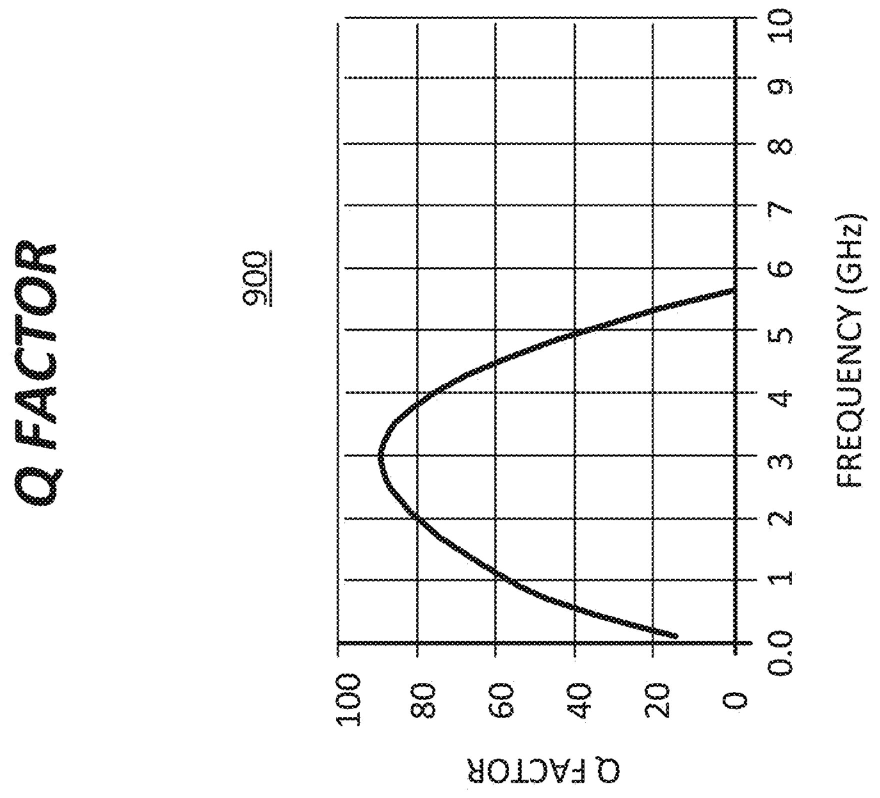
FIG. 9 illustrates an exemplary graph of Q factors of an inductor from a device that includes stacked device portions with via interconnects.

FIGS. 8 and 9 illustrate graphs of exemplary inductance and Q factor for inductor formed from stacked device portions with via interconnects. FIG. 8 illustrates an exemplary graph 800 that includes a plot line of inductance through various frequency for the inductor 103. FIG. 9 illustrates an exemplary graph 900 that includes a plot line of a Q factor through various frequency for the inductor 103.

As mentioned above, one or more the encapsulation layers of a device may include a magnetic layer. For example, the encapsulation layer 140 and/or the encapsulation layer 142 may include at least one magnetic layer. A magnetic layer includes an insulating layer, a dielectric layer and/or a non-electrical conducting material (e.g., material that does not electrically conduct). A magnetic layer may be both a dielectric material and a magnetic material. Thus, a magnetic layer may have both dielectric properties and magnetic properties. A magnetic layer may include one or more materials. A magnetic layer has a permeability value that is greater than 1 (e.g., about 10 or greater, range of 6-20). The magnetic layer may have different permeability values at different frequencies. The permeability value of a magnetic material and/or a magnetic layer, as described in the disclosure is a relative permeability value that is defined as a ratio of the permeability of a material to the permeability of free space. Thus, the permeability values that are described for the magnetic materials and/or magnetic layers that are illustrated and/or described in the disclosure may represent a relative permeability value that is relative to a defined permeability value (e.g., reference permeability value) of free space. In some implementations, free space may be defined to have a defined permeability value of $\mu_0=4\pi\times10^{-7}$ H/m (Henry per meter). A material that has a relative permeability value that is greater than 1 may be considered to be a magnetic material. Similarly, a material layer that has a relative permeability value that is greater than 1 may be considered to be a magnetic layer. A magnetic layer may include a magnetic loss tangent value that is in a range of about 0.01-0.04. For example, the at least one magnetic layer may include a magnetic loss tangent value that is in a range of about 0.01-0.04 for frequencies up to 100 MHz. A magnetic layer may include various magnetic materials. For example, A magnetic layer may include Ajinomoto Magnetic Film (AMF). A magnetic layer may be configured to improve the inductance and/or quality factor of an inductor at low frequencies, that is located in and/or surrounded by the at least one magnetic layer. With improved inductor performance, smaller and more compact inductors may be formed in the integrated passive device and/or the integrated device. Any of the devices (e.g., 100, 200, 300, 400, 500, 600, 700) described in the disclosure may be implemented as a passive device (e.g., discrete passive device) and/or an integrated passive device.

In some implementations, any of the devices or device portions of the disclosure may be implemented as an integrated device. An integrated device may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device may include at least one electronic circuit (e.g., first electronic circuit, second electronic circuit, etc. . . . ). An integrated device may include transistors. An integrated device may be an example of an electrical component and/or electrical device. In some implementations, an integrated device may include a chiplet. A chiplet may be fabricated using a process that provides better yields compared to other processes that are used to fabricate other types of integrated devices, which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). Using several chiplets that perform several functions may reduce the overall cost of a package relative to using a single chip to perform all of the functions of a package.

Exemplary Sequence for Fabricating a Device Portion

FIGS. 10A-10D illustrate an exemplary sequence for providing or fabricating a device portion. In some implementations, the sequence of FIGS. 10A-10D may be used to provide or fabricate any of the device portions described in the disclosure. In some implementations, the sequence of FIGS. 10A-10D may be used to provide or fabricate the first device portion 101 described in the disclosure.

It should be noted that the sequence of FIGS. 10A-10D may combine one or more stages in order to simplify and/or clarify the sequence for providing or fabricating a device portion. In some implementations, the order of the processes may be changed or modified. In some implementations, one or more of processes may be replaced or substituted without departing from the spirit of the disclosure. Different implementations may fabricate a device portion differently. The sequence shown in FIGS. 10A-10D may be implemented on a wafer (e.g., silicon wafer) and then singulated into several device portions.

Figure 10A:
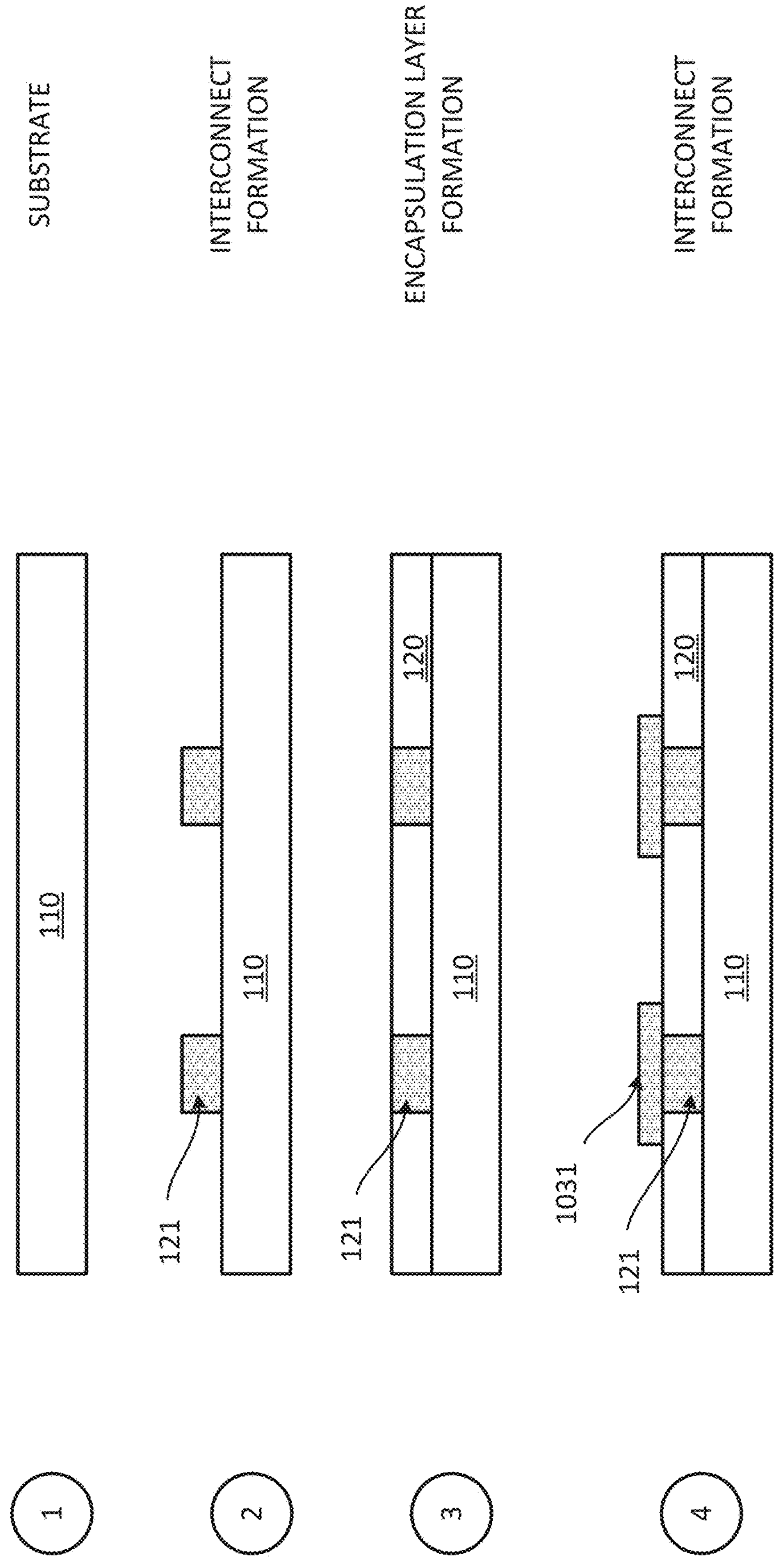
FIGS. 10A-10D illustrate an exemplary sequence for fabricating a device portion with via interconnects.

Stage 1, as shown in FIG. 10A, illustrates a state after a die substrate 110 is provided. The die substrate 110 may include silicon (Si). Providing the die substrate 110 may include providing a wafer (e.g., silicon wafer). In some implementations, a die substrate 110 may be provided with a plurality of filters and/or transistors.

Stage 2 illustrates a state after a plurality of interconnects 121 are formed over the die substrate 110. A plating process and a patterning process may be used to form the plurality of interconnects 121.

Stage 3 illustrates a state after an encapsulation layer 120 is formed. The encapsulation layer 120 may be provided by using a compression and transfer molding process, a sheet molding process, or a liquid molding process. The encapsulation layer 120 may at least partially encapsulate the plurality of interconnects 121. The encapsulation layer 120 may include a mold, a resin and/or an epoxy.

Stage 4 illustrates a state after the plurality of interconnects 1031 are formed over the encapsulation layer 120. The plurality of interconnects 1031 may be coupled to the plurality of interconnects 121. A plating process and a patterning process may be used to form the plurality of interconnects 1031.

Figure 10B:
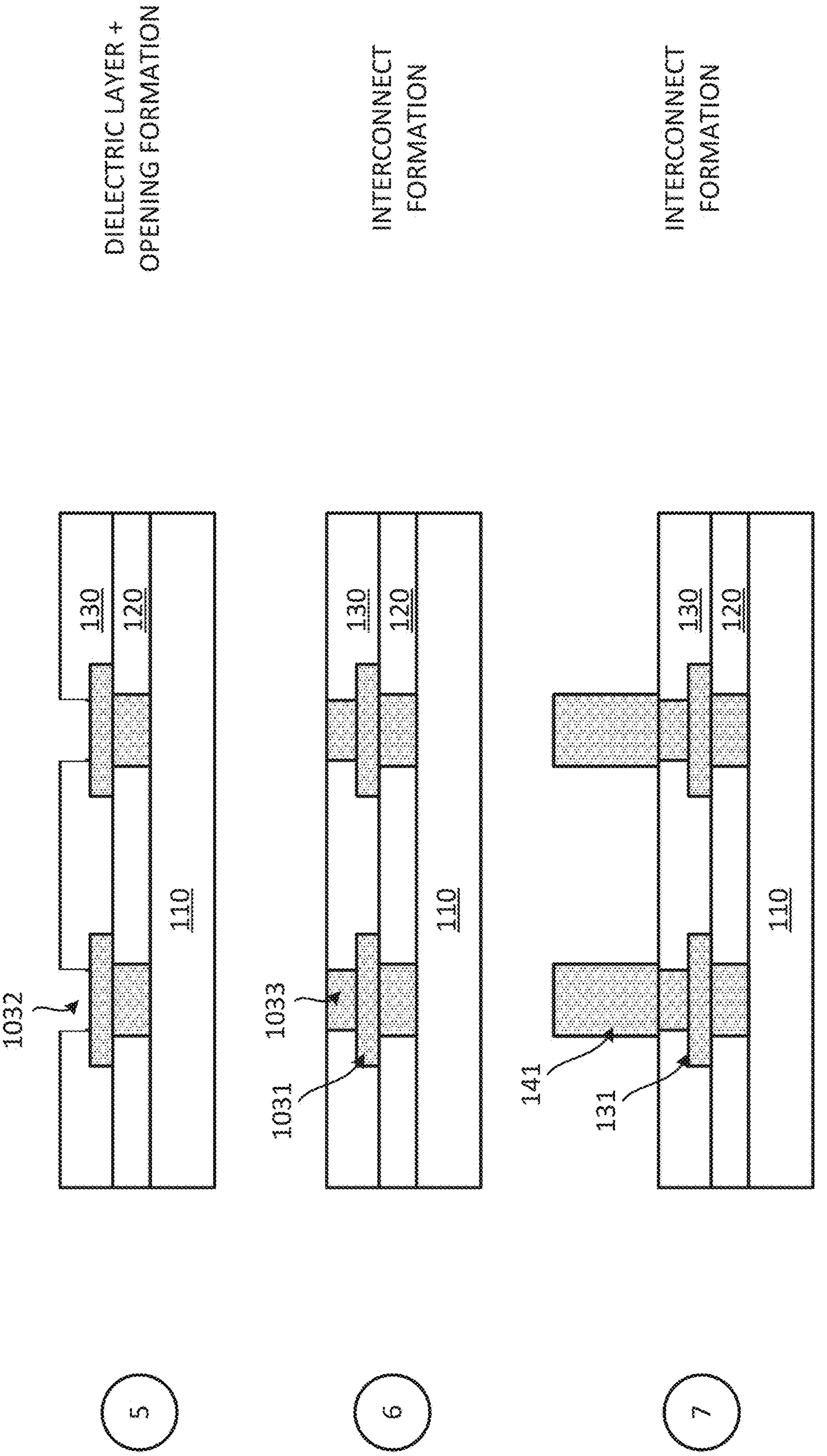

Stage 5, as shown in FIG. 10B, illustrates a state after at least one dielectric layer 130 is formed and patterned. A deposition, a lamination, an exposure, a development and/or an etching process may be used to form and pattern the at least one dielectric layer 130. The at least one dielectric layer 130 may be formed over the encapsulation layer 120. The at least one dielectric layer 130 may include at least one via-hole 1032.

Stage 6 illustrates a state after the plurality of interconnects 1033 are formed. A plating process and a patterning process may be used to form the plurality of interconnects 1033. Forming the plurality of interconnects 1033 may include forming via interconnects in the at least one via-hole 1032 of the at least one dielectric layer 130. The plurality of interconnects 1033 may be coupled to the plurality of interconnects 1031. The plurality of interconnects 1031 and the plurality of interconnects 1033 may represent the plurality of interconnects 131.

Stage 7 illustrates a state after the plurality of via interconnects 141 are formed. A plating process and a patterning process may be used to form the plurality of interconnects 141. The plurality of interconnects 141 may be coupled to the plurality of interconnects 131.

Figure 10C:
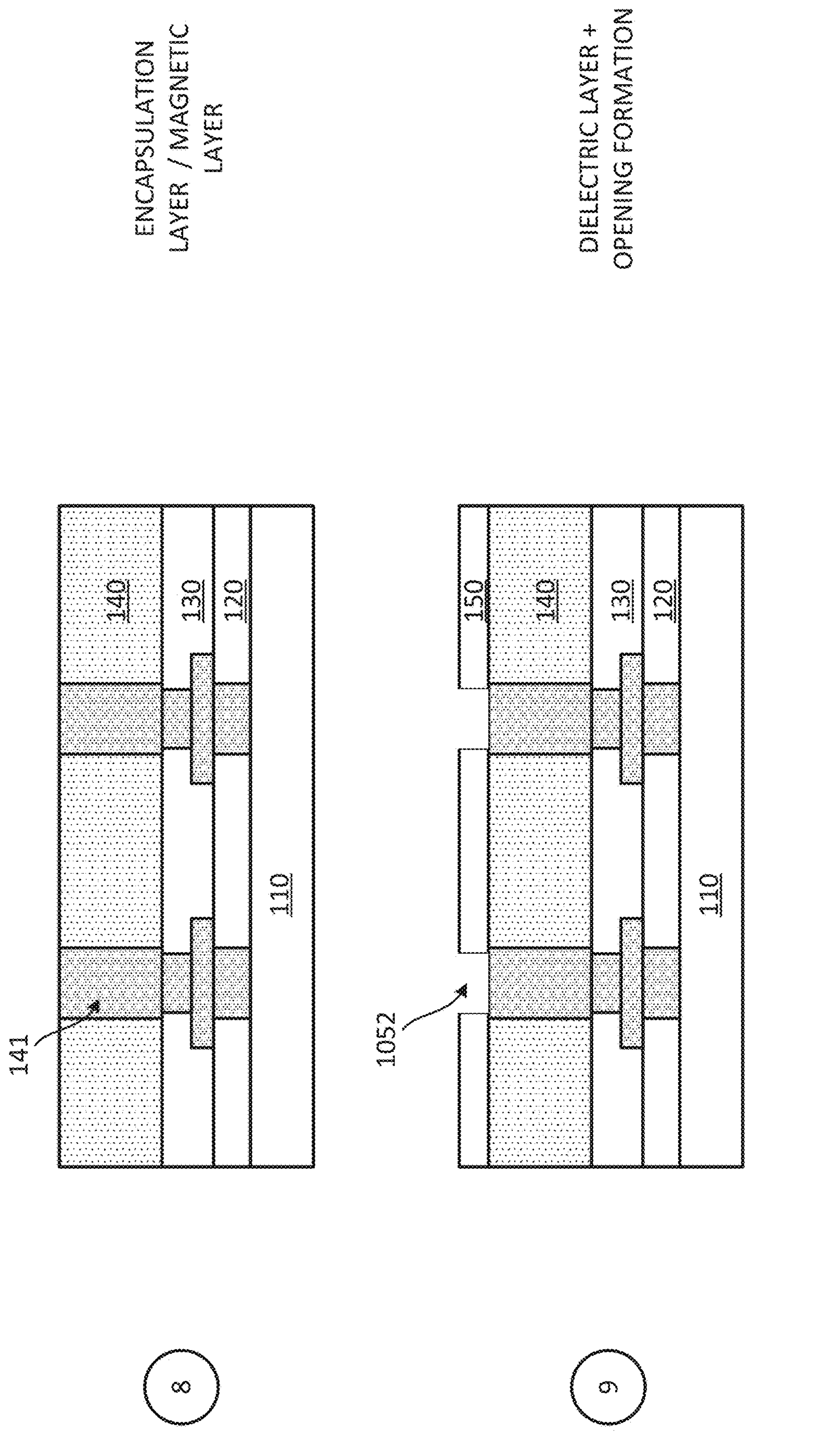

Stage 8, as shown in FIG. 10C, illustrates a state after an encapsulation layer 140 is formed over the dielectric layer 130. The encapsulation layer 140 may be provided by using a compression and transfer molding process, a sheet molding process, or a liquid molding process. The encapsulation layer 140 may at least partially encapsulate the plurality of via interconnects 141. The encapsulation layer 140 may include a mold, a resin and/or an epoxy. The encapsulation layer 140 may include a magnetic layer. In some implementations, the encapsulation layer includes a magnetic layer. In some implementations, a printing process may be used to form paste of the magnetic layer.

Stage 9 illustrates a state after at least one dielectric layer 150 is formed and patterned. A deposition, a lamination, an exposure, a development and/or an etching process may be used to form and pattern the at least one dielectric layer 150. The at least one dielectric layer 150 may be formed over the encapsulation layer 140. The at least one dielectric layer 150 may include at least one via-hole 1052.

Figure 10D:
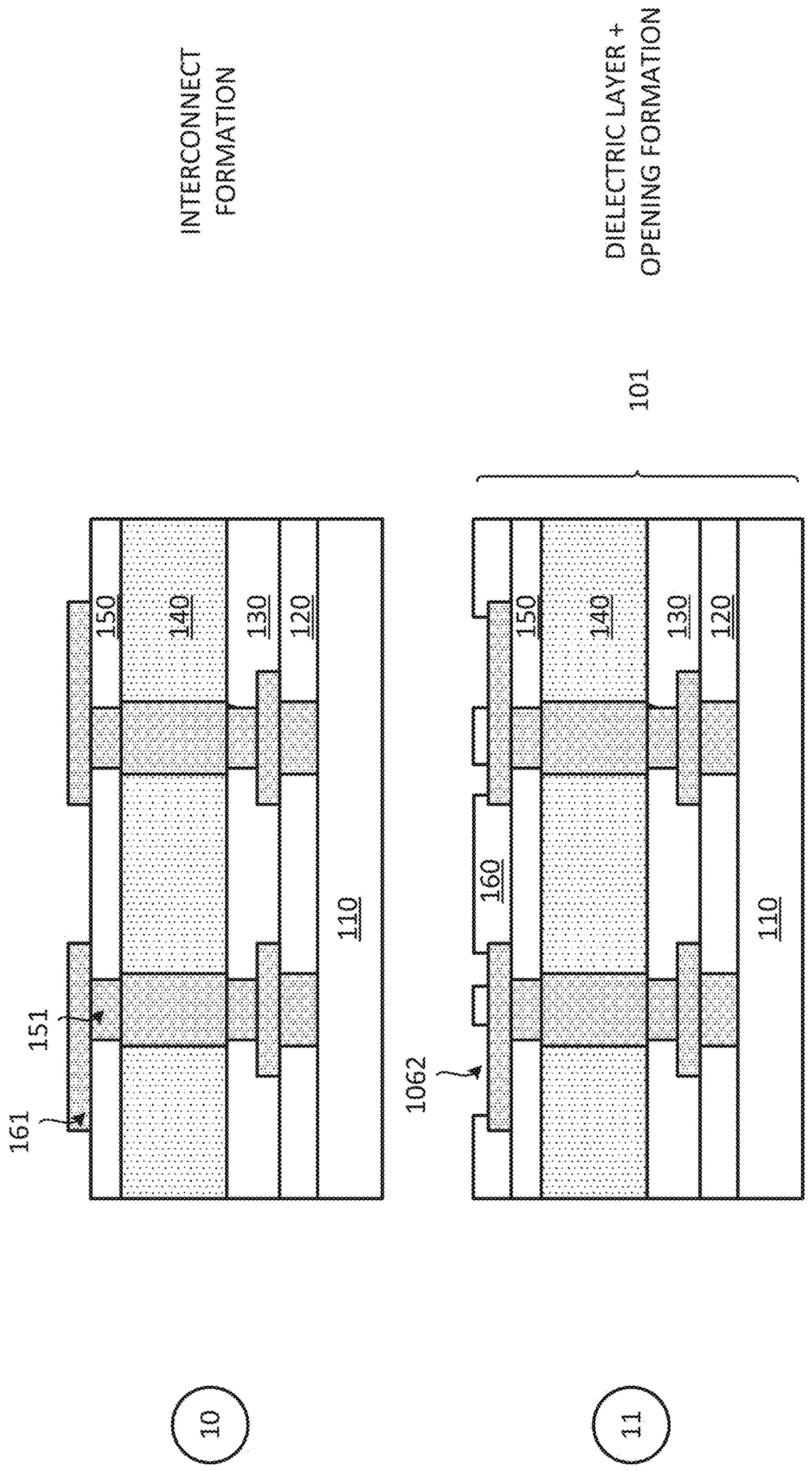

Stage 10, as shown in FIG. 10D, illustrates a state after the plurality of interconnects 151 are formed. A plating process and a patterning process may be used to form the plurality of interconnects 151. Forming the plurality of interconnects 151 may include forming via interconnects in the at least one via-hole 1052 of the at least one dielectric layer 150. The plurality of interconnects 151 may be coupled to the plurality of via interconnects 141.

Stage 10 also illustrates a state after the plurality of interconnects 161 are formed over the dielectric layer 150. The plurality of interconnects 161 may be coupled to the plurality of interconnects 151. A plating process and a patterning process may be used to form the plurality of interconnects 161.

Stage 11 illustrates a state after at least one dielectric layer 160 is formed and patterned. A deposition, a lamination, an exposure, a development and/or an etching process may be used to form and pattern the at least one dielectric layer 160. The at least one dielectric layer 160 may be formed over the dielectric layer 150. The at least one dielectric layer 160 may include at least one opening 1062. Stage 11 may illustrate the first device portion 101.

As mentioned above, the above sequence may be performed on a wafer (e.g., silicon wafer) such that several device portions are formed at the same time, and the wafer is then singulated to form individual device portions. The above sequence may be fabricated in one facility or at several facilities.

Exemplary Sequence for Fabricating a Device Portion

Figure 11:
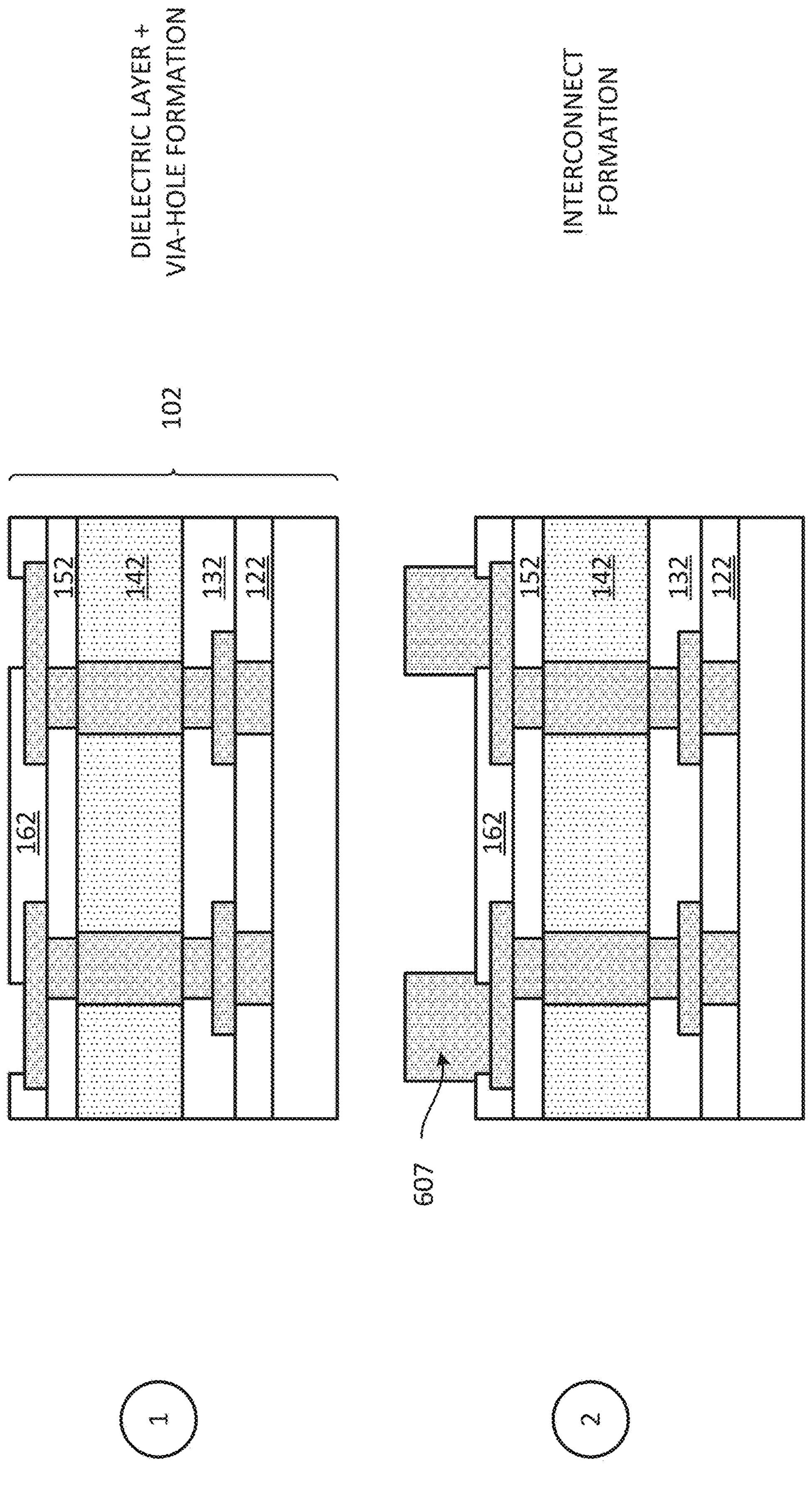
FIG. 11 illustrates an exemplary sequence for fabricating another device portion with via interconnects and pillar interconnects.

FIG. 11 illustrates an exemplary sequence for providing or fabricating a device portion that includes pillar interconnects. In some implementations, the sequence of FIG. 11 may be used to provide or fabricate any of the device portions described in the disclosure. In some implementations, the sequence of FIG. 11 may be used to provide or fabricate the second device portion 102 described in the disclosure.

It should be noted that the sequence of FIG. 11 may combine one or more stages in order to simplify and/or clarify the sequence for providing or fabricating a device portion. In some implementations, the order of the processes may be changed or modified. In some implementations, one or more of processes may be replaced or substituted without departing from the spirit of the disclosure. Different implementations may fabricate a device portion differently. The sequence shown in FIG. 11 may be implemented on a wafer (e.g., silicon wafer) and then singulated into several device portions.

Stage 1, as shown in FIG. 11, illustrates a state after a device portion (e.g., 102) is fabricated or provided. The device portion may include a die substrate 110. In some implementations, the device portion 102 may be fabricated using the process of FIGS. 10A-10D.

Stage 2, as shown in FIG. 11, illustrates a state after the plurality of pillar interconnects 607 are formed. A plating process and a patterning process may be used to form the plurality of pillar interconnects 607. The plurality of pillar interconnects 607 may be coupled to the plurality of interconnects 163. Stage 2 may illustrate the second device portion 102 that includes a plurality of pillar interconnects.

Exemplary Flow Diagram of a Method for Fabricating a Device Portion

Figure 12:
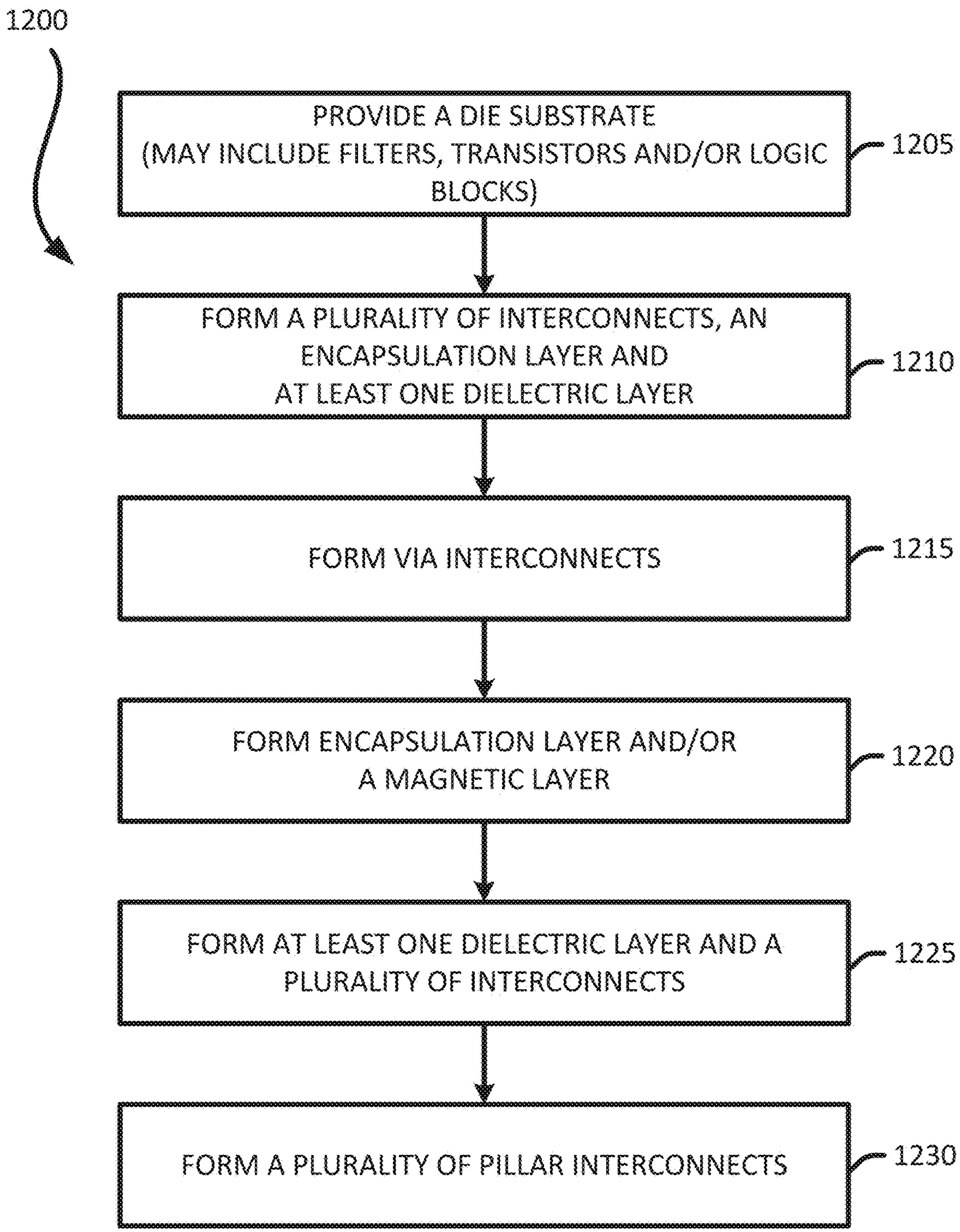
FIG. 12 illustrates an exemplary flow diagram of a method for fabricating a device portion with via interconnects.

In some implementations, fabricating a device portion includes several processes. FIG. 12 illustrates an exemplary flow diagram of a method 1200 for providing or fabricating a device portion. In some implementations, the method 1200 of FIG. 12 may be used to provide or fabricate the first device portion 101, the second device portion 102 or any of the device portions. The method 1200 may be implemented on a wafer (e.g., silicon wafer) and then singulated into several device portions.

It should be noted that the method 1200 of FIG. 12 may combine one or more processes in order to simplify and/or clarify the method for providing or fabricating a device portion. In some implementations, the order of the processes may be changed or modified.

The method provides (at 1205) a die substrate (e.g., 110). The die substrate 110 may include silicon (Si). The die substrate 110 may include a wafer (e.g., silicon wafer). Stage 1 of FIG. 10A, illustrates and describes an example of a state after a die substrate 110 is provided. The die substrate 110 may include silicon (Si). Providing the die substrate 110 may include providing a wafer (e.g., silicon wafer). In some implementations, a die substrate 110 may be provided with a plurality of filters and/or transistors.

The method forms (at 1210) a plurality of interconnects, an encapsulation layer and at least one dielectric layer. Stage 2 of FIG. 10A through Stage 6 of FIG. 10B, illustrate examples of forming a plurality of interconnects, an encapsulation layer and at least one dielectric layer.

Stage 2 of FIG. 10A, illustrates and describes an example a state after a plurality of interconnects 121 are formed over the die substrate 110. A plating process and a patterning process may be used to form the plurality of interconnects 121.

Stage 3 of FIG. 10A, illustrates and describes an example of a state after an encapsulation layer 120 is formed. The encapsulation layer 120 may be provided by using a compression and transfer molding process, a sheet molding process, or a liquid molding process. The encapsulation layer 120 may at least partially encapsulate the plurality of interconnects 121. The encapsulation layer 120 may include a mold, a resin and/or an epoxy.

Stage 4 of FIG. 10A, illustrates and describes an example of a state after the plurality of interconnects 1031 are formed over the encapsulation layer 120. The plurality of interconnects 1031 may be coupled to the plurality of interconnects 121. A plating process and a patterning process may be used to form the plurality of interconnects 1031.

Stage 5 of FIG. 10B, illustrates and describes an example of a state after at least one dielectric layer 130 is formed and patterned. A deposition, a lamination, an exposure, a development and/or an etching process may be used to form and pattern the at least one dielectric layer 130. The at least one dielectric layer 130 may be formed over the encapsulation layer 120. The at least one dielectric layer 130 may include at least one via-hole 1032.

Stage 6 of FIG. 10B, illustrates and describes an example of a state after the plurality of interconnects 1033 are formed. A plating process and a patterning process may be used to form the plurality of interconnects 1033. Forming the plurality of interconnects 1033 may include forming via interconnects in the at least one via-hole 1032 of the at least one dielectric layer 130. The plurality of interconnects 1033 may be coupled to the plurality of interconnects 1031. The plurality of interconnects 1031 and the plurality of interconnects 1033 may represent the plurality of interconnects 131.

The method forms (at 1215) a plurality of via interconnects. Stage 7 of FIG. 10B, illustrates and describes an example of a state after the plurality of via interconnects 141 are formed. A plating process and a patterning process may be used to form the plurality of interconnects 141. The plurality of interconnects 141 may be coupled to the plurality of interconnects 131.

The method forms (at 1220) an encapsulation layer that at least partially encapsulates the plurality of via interconnects. Stage 8 of FIG. 10C, illustrates and describes an example of a state after an encapsulation layer 140 is formed over the dielectric layer 130. The encapsulation layer 140 may be provided by using a compression and transfer molding process, a sheet molding process, or a liquid molding process. The encapsulation layer 140 may at least partially encapsulate the plurality of via interconnects 141. The encapsulation layer 140 may include a mold, a resin and/or an epoxy. The encapsulation layer 140 may include a magnetic layer. In some implementations, the encapsulation layer includes a magnetic layer. In some implementations, a printing process may be used to form paste of the magnetic layer.

The method forms (at 1225) a dielectric layer and a plurality of interconnects. Stage 9 of FIG. 10C, illustrates and describes an example of a state after at least one dielectric layer 150 is formed and patterned. A deposition, a lamination, an exposure, a development and/or an etching process may be used to form and pattern the at least one dielectric layer 150. The at least one dielectric layer 150 may be formed over the encapsulation layer 140. The at least one dielectric layer 150 may include at least one via-hole 1052.

Stage 10 of FIG. 10D, illustrates and describes an example of a state after the plurality of interconnects 151 are formed. A plating process and a patterning process may be used to form the plurality of interconnects 151. Forming the plurality of interconnects 151 may include forming via interconnects in the at least one via-hole 1052 of the at least one dielectric layer 150. The plurality of interconnects 151 may be coupled to the plurality of via interconnects 141.

Stage 10 of FIG. 10D also illustrates and describes an example of a state after the plurality of interconnects 161 are formed over the dielectric layer 150. The plurality of interconnects 161 may be coupled to the plurality of interconnects 151. A plating process and a patterning process may be used to form the plurality of interconnects 161.

Stage 11 of FIG. 10D, illustrates and describes an example of a state after at least one dielectric layer 160 is formed and patterned. A deposition, a lamination, an exposure, a development and/or an etching process may be used to form and pattern the at least one dielectric layer 160. The at least one dielectric layer 160 may be formed over the dielectric layer 150. The at least one dielectric layer 160 may include at least one opening 1062.

The method forms (at 1230) a plurality of pillar interconnects that are coupled to a plurality of interconnects. Stage 2 of FIG. 11, illustrates and describes an example of a state after the plurality of pillar interconnects 607 are formed. A plating process and a patterning process may be used to form the plurality of pillar interconnects 607. The plurality of pillar interconnects 607 may be coupled to the plurality of interconnects 163.

As mentioned above, the device portion may be fabricated as part of a wafer that includes several device portions.

Exemplary Sequence for Fabricating a Device Comprising Stacked Device Portions

FIGS. 13A-13F illustrate an exemplary sequence for providing or fabricating a device that includes stacked device portions. In some implementations, the sequence of FIGS. 13A-13F may be used to provide or fabricate any of the devices described in the disclosure. In some implementations, the sequence of FIGS. 13A-13F may be used to provide or fabricate the device 300 described in the disclosure.

It should be noted that the sequence of FIGS. 13A-13F may combine one or more stages in order to simplify and/or clarify the sequence for providing or fabricating a device. In some implementations, the order of the processes may be changed or modified. In some implementations, one or more of processes may be replaced or substituted without departing from the spirit of the disclosure. Different implementations may fabricate a device differently. The sequence shown in FIGS. 13A-13F may be implemented on a wafer (e.g., silicon wafer) and then singulated into several devices.

Figure 13A:
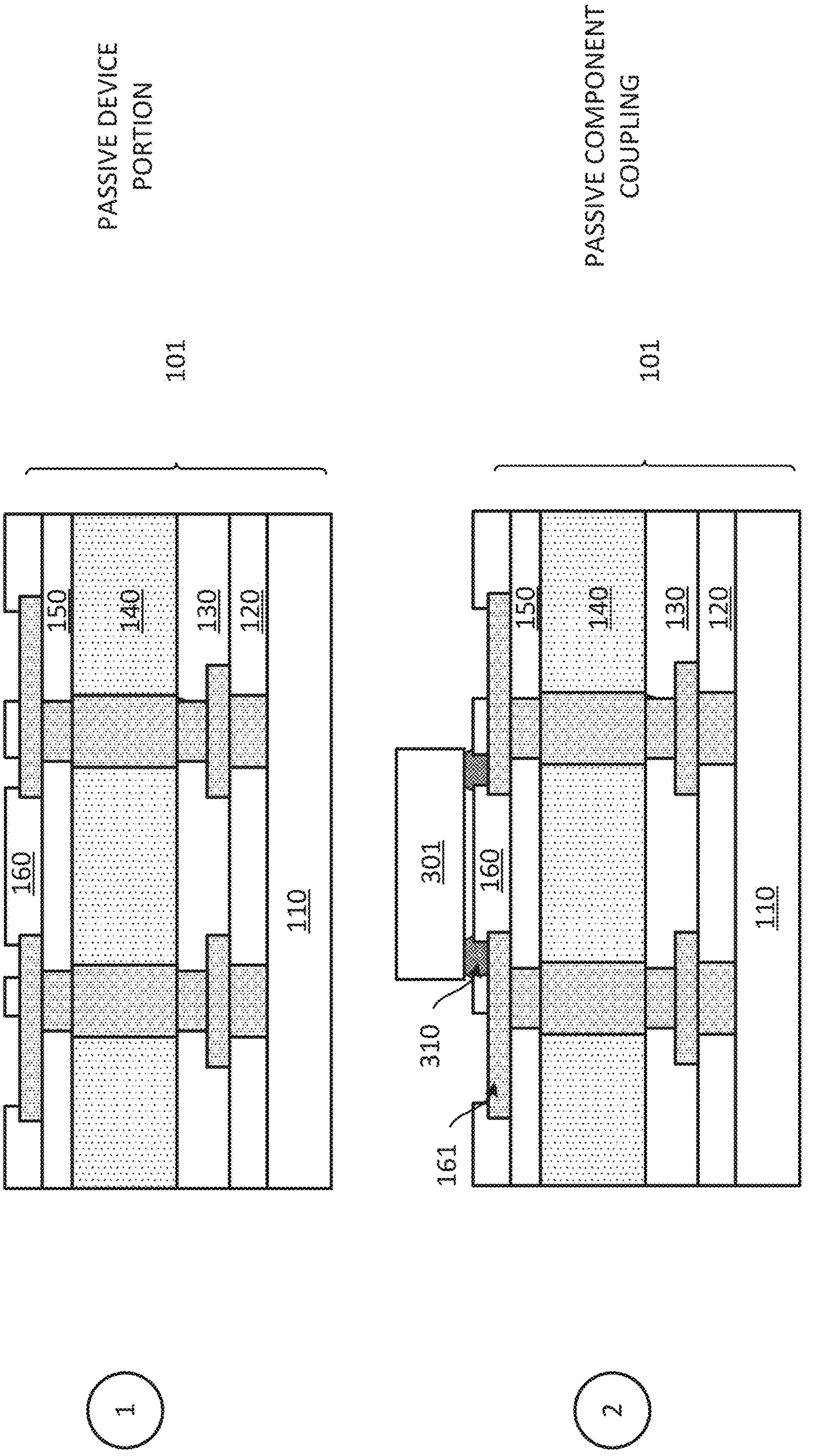
FIGS. 13A-13F illustrate an exemplary sequence for fabricating a device with stacked device portions with via interconnects.

Stage 1, as shown in FIG. 13A, illustrates a state after a first device portion 101 is fabricated and/or provided. FIGS. 10A-10D illustrates an example of a sequence for fabricating a device portion.

Stage 2 illustrates a state after a passive component 301 is coupled to the first device portion 101 through a plurality of solder interconnects 310. A solder reflow process may be used to couple the passive component 301 to the plurality of interconnects 161 of the first device portion 101.

Figure 13B:
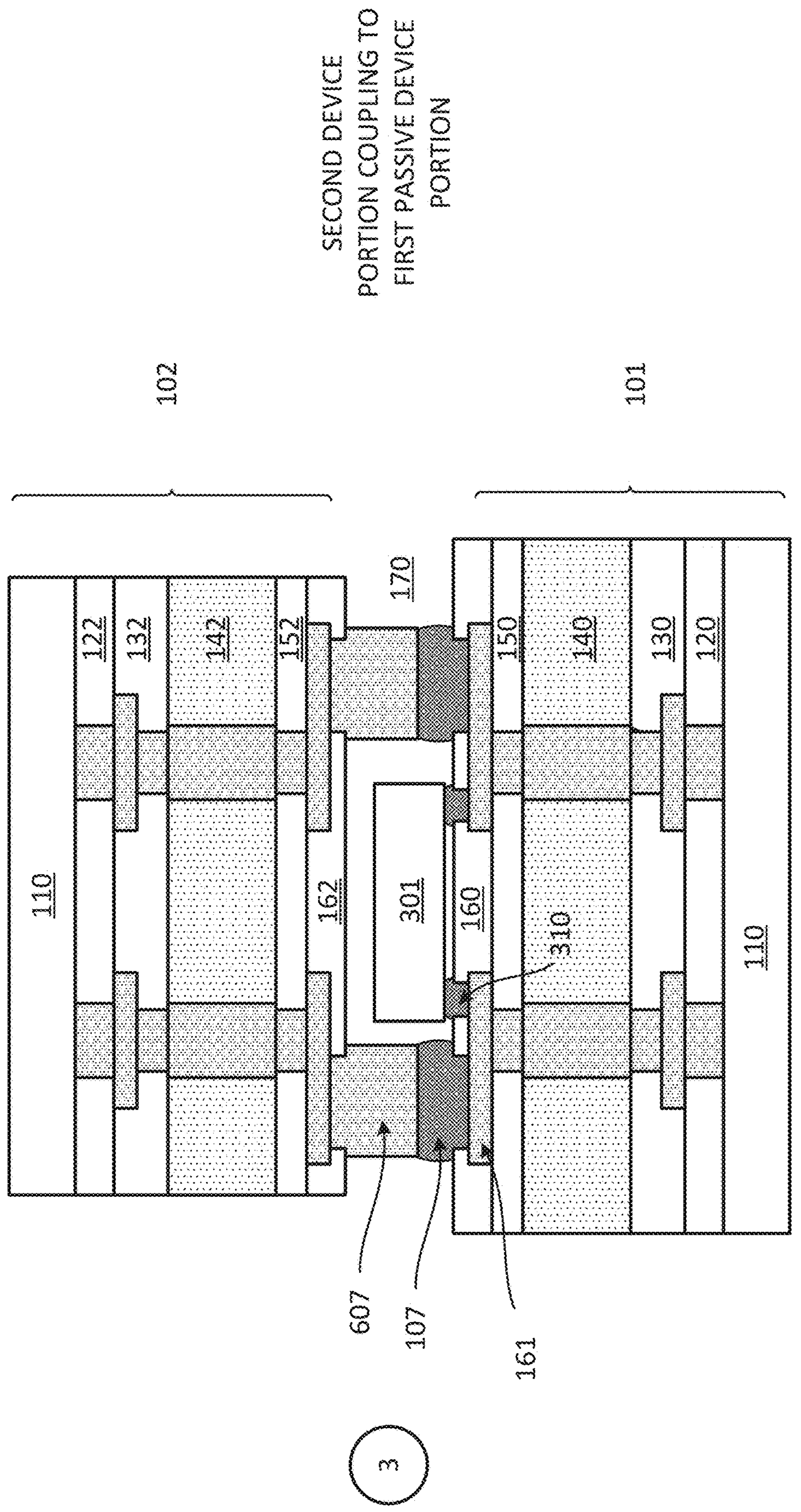

Stage 3, as shown in FIG. 13B, illustrates a state a second device portion 102 is coupled to the first device portion 101. FIGS. 10A-10D illustrates an example of a sequence for fabricating a second device portion. The second device portion 102 includes a die substrate 110. The second device portion 102 may also include a plurality of pillar interconnects 607. The plurality of pillar interconnects 607 is coupled to the plurality of solder interconnects 107. The plurality of solder interconnects 107 is coupled to the plurality of interconnects 161. A solder reflow process may be used to couple the second device portion 102 to the first device portion 101 through the plurality of pillar interconnects 607 and the plurality of solder interconnects 107.

Figure 13C:
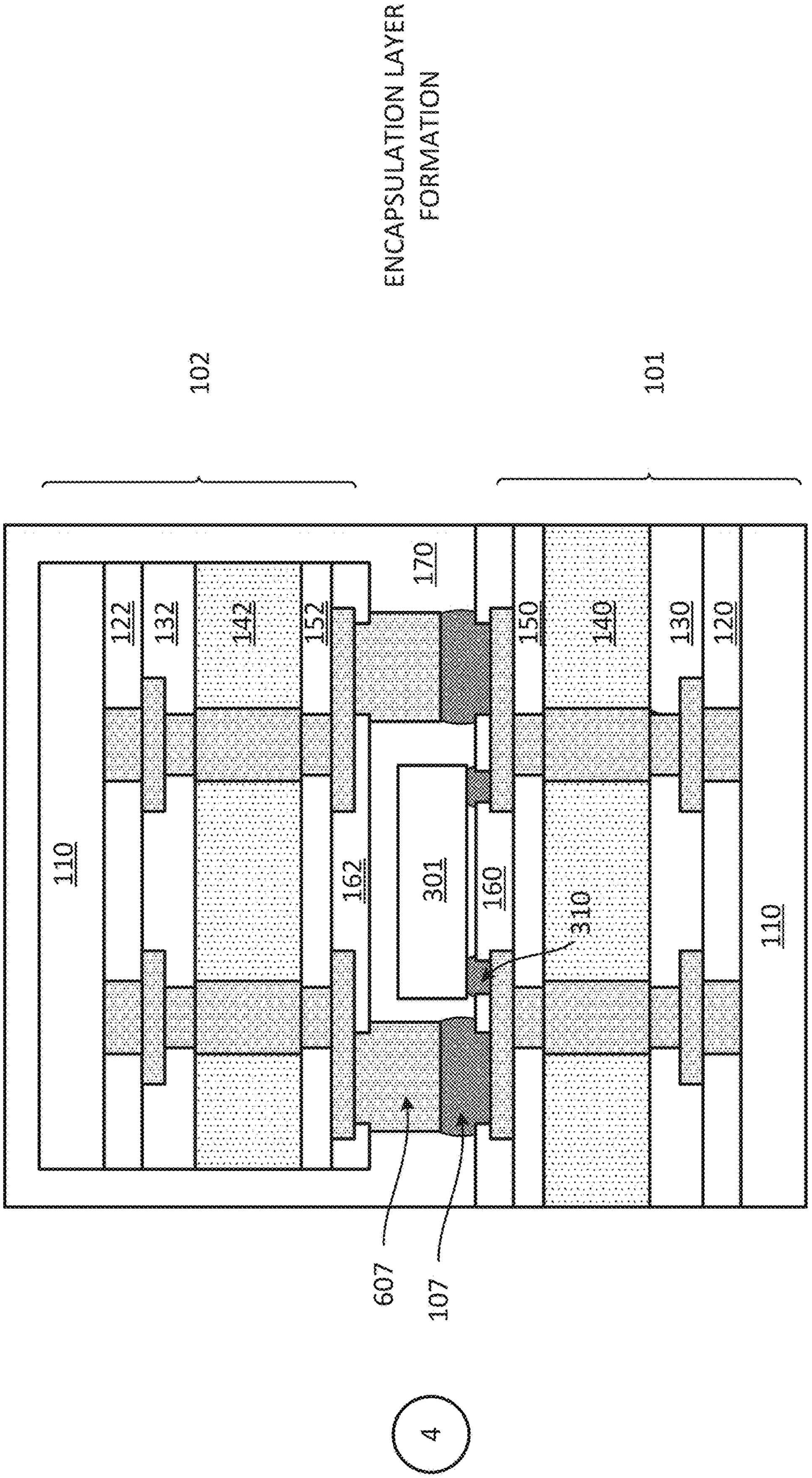

Stage 4, as shown in FIG. 13C illustrates a state after an encapsulation layer 170 is formed over the first device portion 101 and the second device portion 102. A compression and transfer molding process, a sheet molding process, or a liquid molding process may be used to form and provide the encapsulation layer 170. The encapsulation layer 170 may be coupled to a surface of the first device portion 101. The encapsulation layer 170 may at least partially encapsulate the passive component 301, the plurality of pillar interconnects 607, the plurality of solder interconnects 107 and the second device portion 102. The encapsulation layer 170 may be over-molded over the second device portion 102.

Figure 13D:
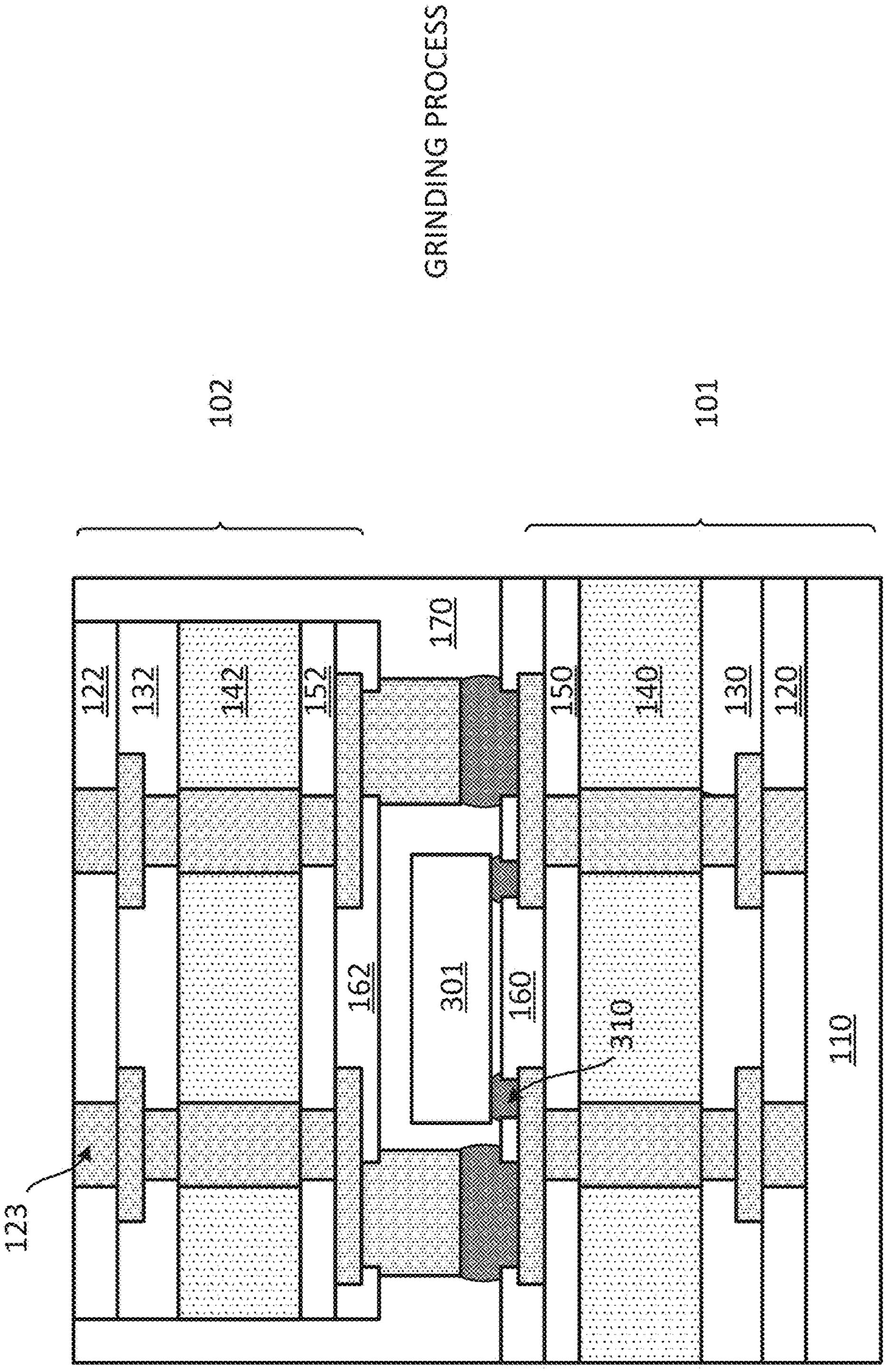

Stage 5, as shown in FIG. 13D, illustrates a state after portions of the encapsulation layer 170 and portions of the second device portion 102 are removed. For example a grinding process and/or polishing process may be used to remove the die substrate 110 of the second device portion 102 and portions of the encapsulation layer 170, leaving the encapsulation layer 122 exposed and the plurality of interconnects 123 exposed.

Figure 13E:
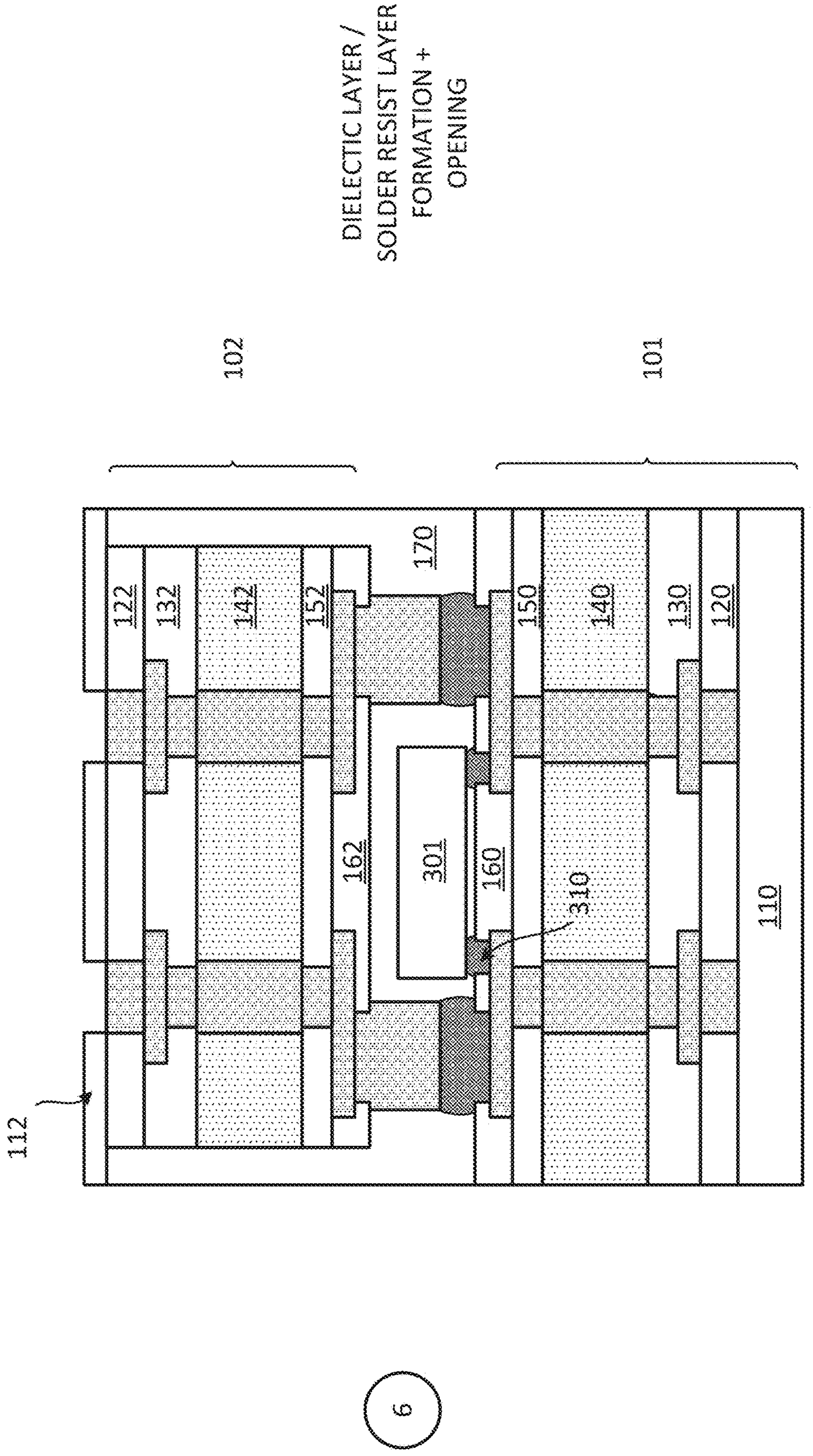

Stage 6, as shown in FIG. 13E, illustrates a state after a dielectric layer 112 is formed over the encapsulation layer 122 and the encapsulation layer 170. It is noted that in some implementations, the encapsulation layer 122 and the encapsulation layer 170 may be the same or similar. There may be openings in the dielectric layer 112. A deposition, a lamination, an exposure, a development and/or an etching process may be used to form and pattern the dielectric layer 112. In some implementations, the dielectric layer 112 may be solder resist layer.

Figure 13F:
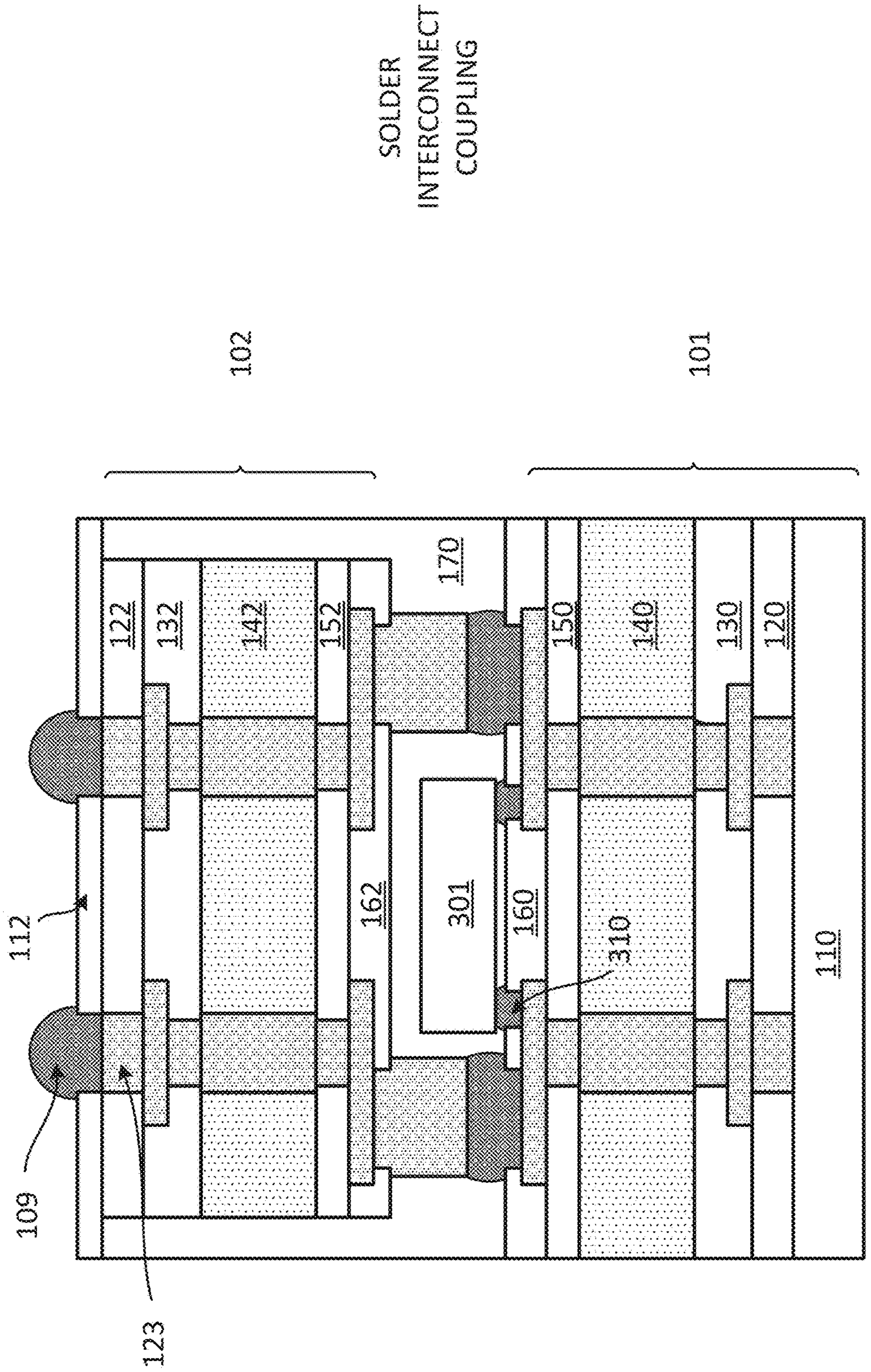

Stage 7, as shown in FIG. 13F, illustrates a state after a plurality of solder interconnects are coupled to the plurality of interconnects 123. A solder reflow process may be used to couple the plurality of solder interconnects 109 to the plurality of interconnects 123. The plurality of solder interconnects 109 may be coupled to the plurality of interconnects 123 through openings in the dielectric layer 112. Stage 7 may illustrate the device 300 that includes stacked device portions with via interconnects.

Figure 14:
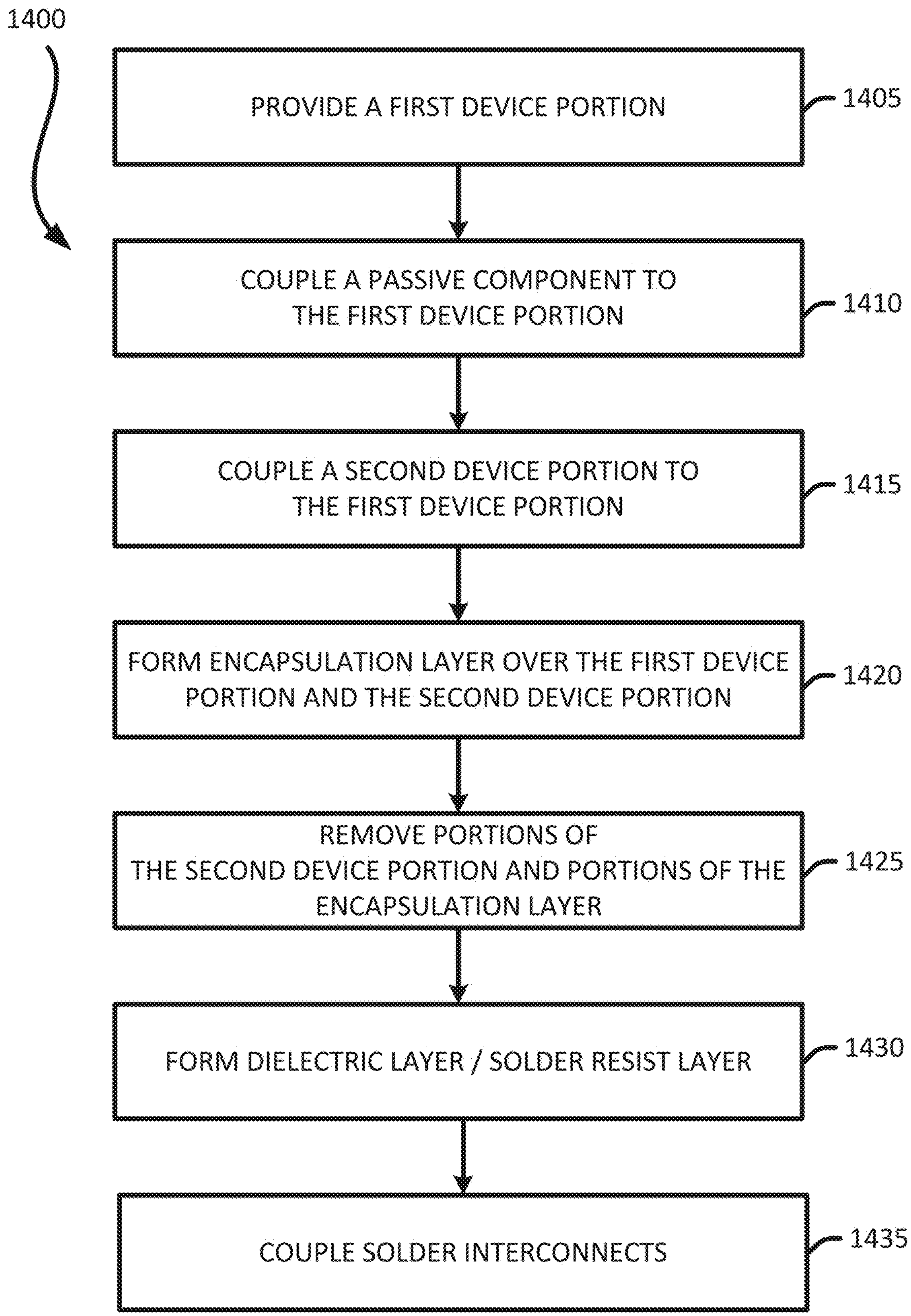
FIG. 14 illustrates an exemplary flow diagram of a method for fabricating a device with stacked device portions with via interconnects.

Exemplary Flow Diagram of a Method for Fabricating a Device with Stacked Device Portions In some implementations, fabricating a device that includes stacked device portions includes several processes. FIG. 14 illustrates an exemplary flow diagram of a method 1400 for providing or fabricating a device that includes stacked device portions. In some implementations, the method 1400 of FIG. 14 may be used to provide or fabricate the device 300. The method 1400 may be implemented on a wafer (e.g., silicon wafer) and then singulated into several integrated devices.

It should be noted that the method 1400 of FIG. 14 may combine one or more processes in order to simplify and/or clarify the method for providing or fabricating a device that includes stacked device portions. For example, one or more of the processes of the method 1400 may include one or more of the processes of the method 1200. In some implementations, the order of the processes may be changed or modified.

The method provides (at 1405) a first device portion. Stage 1 of FIG. 13A, illustrates and describes an example of a state after a first device portion 101 is fabricated and/or provided. FIGS. 10A-10D illustrates an example of a sequence for fabricating a device portion.

The method couples (at 1410) a passive component to the device portion. Stage 2 of FIG. 13A, illustrates and describes an example of a state after a passive component 301 is coupled to the first device portion 101 through a plurality of solder interconnects 310. A solder reflow process may be used to couple the passive component 301 to the plurality of interconnects 161 of the first device portion 101.

The method couples (at 1415) a second device portion to the first device portion. Stage 3 of FIG. 13B, illustrates and describes an example of a state a second device portion 102 is coupled to the first device portion 101. FIGS. 10A-10D illustrates an example of a sequence for fabricating a second device portion. The second device portion 102 includes a die substrate 110. The second device portion 102 may also include a plurality of pillar interconnects 607. The plurality of pillar interconnects 607 is coupled to the plurality of solder interconnects 107. The plurality of solder interconnects 107 is coupled to the plurality of interconnects 161. A solder reflow process may be used to couple the second device portion 102 to the first device portion 101 through the plurality of pillar interconnects 607 and the plurality of solder interconnects 107.

The method forms (at 1420) an encapsulation layer over the first device portion and the second device portion. Stage 4 of FIG. 13C, illustrates and describes an example of a state after an encapsulation layer 170 is formed over the first device portion 101 and the second device portion 102. A compression and transfer molding process, a sheet molding process, or a liquid molding process may be used to form and provide the encapsulation layer 170. The encapsulation layer 170 may be coupled to a surface of the first device portion 101. The encapsulation layer 170 may at least partially encapsulate the passive component 301, the plurality of pillar interconnects 607, the plurality of solder interconnects 107 and the second device portion 102. The encapsulation layer 170 may be over-molded over the second device portion 102.

The method removes (at 1425) portions of the encapsulation layer and portions of the second device portion. Stage 5 of FIG. 13D, illustrates and describes an example of a state after portions of the encapsulation layer 170 and portions of the second device portion 102 are removed. For example a grinding process and/or polishing process may be used to remove the die substrate 110 of the second device portion 102 and portions of the encapsulation layer 170, leaving the encapsulation layer 122 exposed and the plurality of interconnects 123 exposed.

The method forms (at 1430) a dielectric layer. Stage 6 of FIG. 13E, illustrates and describes an example of a state after a dielectric layer 112 is formed over the encapsulation layer 122 and the encapsulation layer 170. It is noted that in some implementations, the encapsulation layer 122 and the encapsulation layer 170 may be the same or similar. There may be openings in the dielectric layer 112. A deposition, a lamination, an exposure, a development and/or an etching process may be used to form and pattern the dielectric layer 112. In some implementations, the dielectric layer 112 may be solder resist layer.

The method couples (at 1435) a plurality of solder interconnects to the second device portion. Stage 7 of FIG. 13F, illustrates and describes an example of a state after a plurality of solder interconnects are coupled to the plurality of interconnects 123. A solder reflow process may be used to couple the plurality of solder interconnects 109 to the plurality of interconnects 123. The plurality of solder interconnects 109 may be coupled to the plurality of interconnects 123 through openings in the dielectric layer 112. Stage 7 may illustrate the device 300 that includes stacked device portions with via interconnects.

Exemplary Electronic Devices

Figure 15:
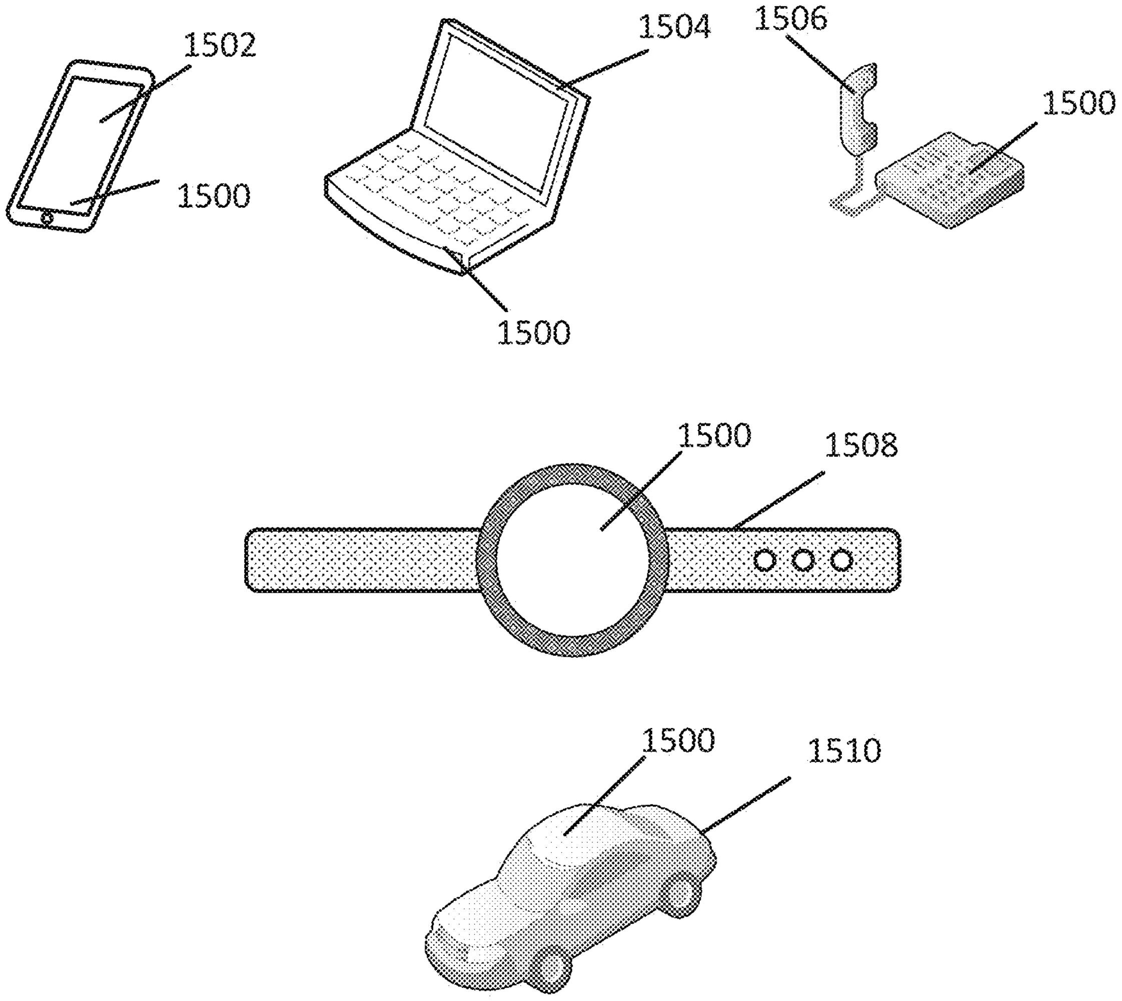
FIG. 15 illustrates various electronic devices that may integrate a die, an electronic circuit, an integrated device, an integrated passive device (IPD), a passive component, a package, and/or a device package described herein.

FIG. 15 illustrates various electronic devices that may be integrated with any of the aforementioned device, integrated device, integrated circuit (IC) package, integrated circuit (IC) device, semiconductor device, integrated circuit, die, interposer, package, package-on-package (POP), System in Package (SiP), or System on Chip (SoC). For example, a mobile phone device 1502, a laptop computer device 1504, a fixed location terminal device 1506, a wearable device 1508, or automotive vehicle 1510 may include a device 1500 as described herein. The device 1500 may be, for example, any of the devices and/or integrated circuit (IC) packages described herein. The devices 1502, 1504, 1506 and 1508 and the vehicle 1510 illustrated in FIG. 15 are merely exemplary. Other electronic devices may also feature the device 1500 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-9, 10A-10D, 11, 12, 13A-13F and/or 14-15 may be rearranged and/or combined into a single component, process, feature or function or embodied in several components, processes, or functions. Additional elements, components, processes, and/or functions may also be added without departing from the disclosure. It should also be noted FIGS. 1-9, 10A-10D, 11, 12, 13A-13F and/or 14-15 and its corresponding description in the present disclosure is not limited to dies and/or ICs. In some implementations, FIGS. 1-9, 10A-10D, 11, 12, 13A-13F and/or 14-15 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (POP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. A first component that is "located" in a second component may mean that the first component is "partially located" in the second component or "completely located" in the second component. A first component that is "embedded" in a second component may mean that the first component is "partially embedded" in the second component or "completely embedded" in the second component. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

Aspect 1: A device (e.g., passive device, integrated passive device) comprising: a first device portion (e.g., first passive device portion) comprising: a die substrate; at least one first dielectric layer; a first plurality of interconnects; a first encapsulation layer; and a first plurality of via interconnects located at least in the first encapsulation layer; a second device portion (e.g., second passive device portion) comprising: at least one second dielectric layer; a second plurality of interconnects; a second encapsulation layer; and a second plurality of via interconnects located at least in the second encapsulation layer; and a first plurality of solder interconnects coupled to the first device portion and the second device portion, wherein the first plurality of interconnects, the first plurality of via interconnects, the first plurality of solder interconnects, the second plurality of interconnects and the second plurality of via interconnects are configured to operate as an inductor.

Aspect 2: The device of aspect 1, wherein the first encapsulation layer includes a magnetic layer or epoxy mold, and/or wherein the second encapsulation layer includes a magnetic layer or epoxy mold.

Aspect 3: The device of aspect 2, wherein the magnetic layer includes an insulating layer and/or a dielectric layer, wherein the magnetic layer includes a non-electrical conducting material, and wherein the magnetic layer has a relative permeability value that is greater than 1.

Aspect 4: The device of aspects 1 through 3, wherein the first device portion is a first passive device portion, and wherein the second device portion is a second passive device portion.

Aspect 5: The device of aspects 1 through 4, wherein the die substrate includes a plurality of filters.

Aspect 6: The device of aspect 5, wherein the device includes an acoustic device.

Aspect 7: The device of aspects 1 through 6, wherein the first plurality of interconnects, the first plurality of via interconnects, the first plurality of solder interconnects, the second plurality of interconnects and the second plurality of via interconnects are configured to operate as a solenoid inductor.

Aspect 8: The device of aspects 1 through 7, wherein the first plurality of interconnects includes a first plurality of first metallization interconnects and a second plurality of first metallization interconnects, and wherein the second plurality of interconnects includes a first plurality of second metallization interconnects and a second plurality of second metallization interconnects.

Aspect 9: The device of aspect 8, wherein the first plurality of via interconnects are coupled to the first plurality of first metallization interconnects and the second plurality of first metallization interconnects, and wherein the second plurality of via interconnects are coupled to the first plurality of second metallization interconnects and the second plurality of second metallization interconnects.

Aspect 10: The device of aspects 1 through 9, wherein the first plurality of solder interconnects is horizontally offset to the first plurality of via interconnects and the second plurality of via interconnects.

Aspect 11: The device of aspects 1 through 10, further comprising a plurality of pillar interconnects coupled to the first plurality of solder interconnects and the first plurality of interconnects.

Aspect 12: The device of aspects 1 through 11, further comprising a plurality of pillar interconnects coupled to the first plurality of solder interconnects and the second plurality of interconnects.

Aspect 13: The device of aspects 1 through 10, further comprising: a first plurality of pillar interconnects coupled to the first plurality of solder interconnects and the first plurality of interconnects, and a second plurality of pillar interconnects coupled to the first plurality of solder interconnects and the second plurality of interconnects.

Aspect 14: The device of aspects 1 through 13, further comprising a third encapsulation layer at least partially encapsulating the second device portion and the first plurality of solder interconnects, wherein the third encapsulation layer is coupled to a surface of the first device portion.

Aspect 15: The device of aspects 1 through 14, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 16: A method for fabricating a device (e.g., passive device, integrated passive device), comprising: providing a first device portion (e.g., first passive device portion) comprising: a die substrate; at least one first dielectric layer; a first plurality of interconnects; a first encapsulation layer; and a first plurality of via interconnects located at least in the first encapsulation layer; coupling a second device portion (e.g., second passive device portion) to the first device portion through a first plurality of solder interconnects, the second device portion comprising: at least one second dielectric layer; a second plurality of interconnects; a second encapsulation layer; and a second plurality of via interconnects located at least in the second encapsulation layer, wherein the first plurality of solder interconnects are coupled to the first device portion and the second device portion, wherein the first plurality of interconnects, the first plurality of via interconnects, the first plurality of solder interconnects, the second plurality of interconnects and the second plurality of via interconnects are configured to operate as an inductor.

Aspect 17: The method of aspect 16, wherein the first encapsulation layer includes a magnetic layer or epoxy mold, and/or wherein the second encapsulation layer includes a magnetic layer or epoxy mold.

Aspect 18: The method of aspects 16 through 17, further comprising forming a third encapsulation layer that at least partially encapsulates the second device portion and the first plurality of solder interconnects, wherein the third encapsulation layer is coupled to a surface of the first device portion.

Aspect 19: The method of aspects 16 through 18, wherein the first device portion is a first passive device portion, and wherein the second device portion is a second passive device portion.

Aspect 20: The method of aspect 16, wherein the die substrate includes a plurality of filters.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A device comprising:

a first device portion comprising:

a die substrate;

at least one first dielectric layer;

a first plurality of interconnects;

a first encapsulation layer comprising a magnetic layer; and a first plurality of via interconnects located at least in the first encapsulation layer;

a second device portion comprising:

at least one second dielectric layer;

a second plurality of interconnects;

a second encapsulation layer; and a second plurality of via interconnects located at least in the second encapsulation layer; and a first plurality of solder interconnects coupled to the first device portion and the second device portion, wherein the first plurality of interconnects, the first plurality of via interconnects, the first plurality of solder interconnects, the second plurality of interconnects and the second plurality of via interconnects are configured to operate as an inductor.

2. The device of claim 1, wherein the second encapsulation layer includes another magnetic layer and/or an epoxy mold.

3. The device of claim 1, wherein the first device portion is a first passive device portion, and wherein the second device portion is a second passive device portion.

4. The device of claim 1, further comprising a plurality of pillar interconnects coupled to the first plurality of solder interconnects and the first plurality of interconnects.

5. The device of claim 1, further comprising a plurality of pillar interconnects coupled to the first plurality of solder interconnects and the second plurality of interconnects.

6. The device of claim 1, wherein the first plurality of solder interconnects is horizontally offset to the first plurality of via interconnects and the second plurality of via interconnects.

7. The device of claim 1, wherein the first plurality of interconnects, the first plurality of via interconnects, the first plurality of solder interconnects, the second plurality of interconnects and the second plurality of via interconnects are configured to operate as a solenoid inductor.

8. The device of claim 1, wherein the magnetic layer includes an insulating layer and/or a dielectric layer, wherein the magnetic layer includes a non-electrical conducting material, and wherein the magnetic layer has a relative permeability value that is greater than 1.

9. The device of claim 1, further comprising a third encapsulation layer at least partially encapsulating the second device portion and the first plurality of solder interconnects, wherein the third encapsulation layer is coupled to a surface of the first device portion.

10. The device of claim 1, further comprising:

a first plurality of pillar interconnects coupled to the first plurality of solder interconnects and the first plurality of interconnects, and a second plurality of pillar interconnects coupled to the first plurality of solder interconnects and the second plurality of interconnects.

11. The device of claim 1, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

12. The device of claim 1, wherein the die substrate includes a plurality of filters and/or a plurality of transistors.

13. The device of claim 12, wherein the device includes an acoustic device.

14. The device of claim 1, wherein the first plurality of interconnects includes a first plurality of first metallization interconnects and a second plurality of first metallization interconnects, and wherein the second plurality of interconnects includes a first plurality of second metallization interconnects and a second plurality of second metallization interconnects.

15. The device of claim 14, wherein the first plurality of via interconnects are coupled to the first plurality of first metallization interconnects and the second plurality of first metallization interconnects, and wherein the second plurality of via interconnects are coupled to the first plurality of second metallization interconnects and the second plurality of second metallization interconnects.

* * * * *